(12) United States Patent
Wang et al.

(10) Patent No.: US 10,777,502 B2
(45) Date of Patent: Sep. 15, 2020

(54) SEMICONDUCTOR CHIP, PACKAGE STRUCTURE, AND PACAKGE-ON-PACKAGE STRUCTURE

(71) Applicant: Taiwan Semiconductor Manufacturing Co., Ltd., Hsinchu (TW)

(72) Inventors: Chuei-Tang Wang, Taichung (TW); Chung-Hao Tsai, Changhua County (TW); Chen-Hua Yu, Hsinchu (TW); Wei-Ting Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/667,911

(22) Filed: Oct. 30, 2019

(65) Prior Publication Data
US 2020/0066631 A1     Feb. 27, 2020

Related U.S. Application Data

(63) Continuation of application No. 16/035,710, filed on Jul. 16, 2018, now Pat. No. 10,504,835.

(51) Int. Cl.
| | | |
|---|---|---|
| *H01L 23/522* | (2006.01) | |
| *H01L 23/00* | (2006.01) | |
| *H01L 23/532* | (2006.01) | |
| *H01L 49/02* | (2006.01) | |

(Continued)

(52) U.S. Cl.
CPC ........ *H01L 23/5226* (2013.01); *H01L 21/563* (2013.01); *H01L 21/76876* (2013.01); *H01L 23/53238* (2013.01); *H01L 24/09* (2013.01); *H01L 24/17* (2013.01); *H01L 28/40* (2013.01); *H01L 2224/02333* (2013.01)

(58) Field of Classification Search
CPC ........... H01L 23/5226; H01L 23/53238; H01L 24/09; H01L 24/17; H01L 21/563; H01L 21/76876; H01L 28/40; H01L 2224/02333
See application file for complete search history.

(56) References Cited

U.S. PATENT DOCUMENTS

| | | | |
|---|---|---|---|
| 7,218,005 B2 * | 5/2007 | Tago | .................... H01L 23/3114 257/777 |
| 9,000,584 B2 | 4/2015 | Lin et al. | |
| 9,048,222 B2 | 6/2015 | Hung et al. | |

(Continued)

*Primary Examiner* — Peniel M Gumedzoe
(74) *Attorney, Agent, or Firm* — JCIPRNET

(57) ABSTRACT

A semiconductor chip including a die substrate, a plurality of first bonding structures, a plurality of conductive elements, at least one integrated device, a plurality of conductive posts and a protection layer is provided. The first bonding structures are disposed on the die substrate. The conductive elements are disposed on the die substrate adjacent to the first bonding structures. The integrated device is disposed on the die substrate over the first bonding structures, wherein the integrated device includes a plurality of second bonding structures and a plurality of conductive pillars, and the second bonding structures are hybrid bonded to the first bonding structures. The conductive posts are disposed on the conductive elements and surrounding the integrated device. The protection layer is encapsulating the integrated device and the conductive posts.

20 Claims, 28 Drawing Sheets

(51) Int. Cl.
*H01L 21/56* (2006.01)
*H01L 21/768* (2006.01)

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

\* cited by examiner

SEMICONDUCTOR CHIP, PACKAGE STRUCTURE, AND PACAKGE-ON-PACKAGE STRUCTURE

CROSS-REFERENCE TO RELATED APPLICATION

This application is a continuation application of U.S. application Ser. No. 16/035,710, filed on Jul. 16, 2018, now allowed. The entirety of each of the above-mentioned patent applications is hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
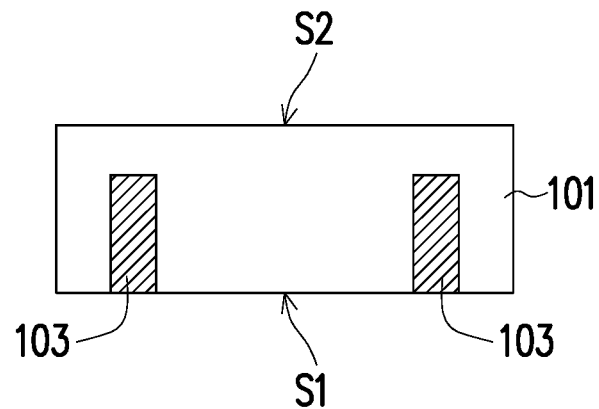
FIG. 1A to FIG. 1E are schematic cross-sectional views of various stages in a method of fabricating an integrated device according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are schematic cross-sectional views of various stages in a method of fabricating an integrated device according to some exemplary embodiments of the present disclosure. Referring to FIG. 1A, a substrate layer 101 having a first surface S1 and a second surface S2 opposite to the first surface S1 is provided. In some embodiments, the substrate layer 101 is a silicon substrate, or a silicon-on-insulator (SOI) substrate. In certain embodiments, a plurality of through vias 103 is formed in the substrate layer 101. The through vias 103 are for example, conductive through vias made of materials such as copper, copper alloy or the like. In some embodiments, the through vias 103 are formed in the substrate layer 101, and portions of the through vias 103 are exposed at the first surface S1 of the substrate layer 101.

Figure 1B:
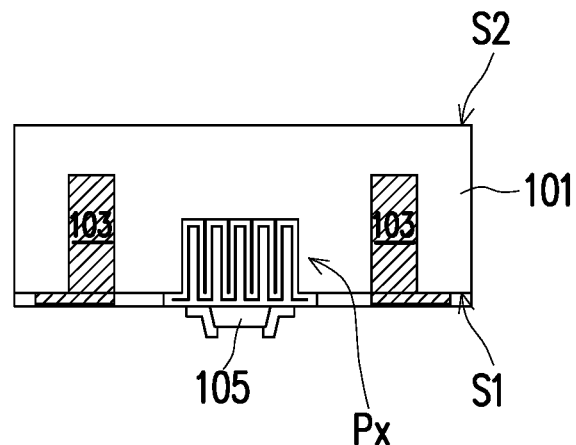

Referring to FIG. 1B, after forming the through vias 103, an integrated component Px is formed within the substrate layer 101, wherein the integrated component Px is surrounded by the through vias 103. In the exemplary embodiment, the integrated component Px may include passive components such as a capacitor, an inductor, a resistor or the like. In certain embodiments, the integrated component Px may include active components such as transistors or the like. In one embodiment, the integrated component Px is a trench capacitor formed in the substrate layer 101. After forming the integrated component Px, a conductive pad 105 may be formed on the first surface S1 of the substrate layer 101. In some embodiments, the conductive pad 105 are electrically connected to the integrated component Px. Furthermore, the conductive pad 105 may be aluminum pads, copper pads or other suitable metal pads. Although only one conductive pad 105 is illustrated in the embodiment, however, the disclosure is not limited thereto. In some other embodiments, the number of conductive pad 105 may be adjusted based on design requirement.

Figure 1C:
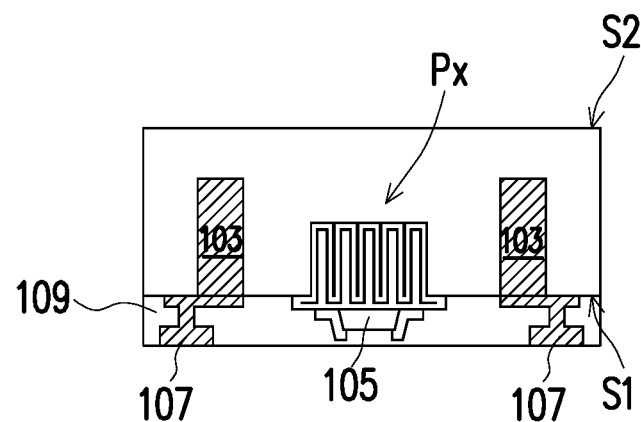

Referring to FIG. 1C, in a next step, a plurality of bonding structures 107 (second bonding structures) is formed on the first surface S1 of the substrate layer 101. In some embodiments, the bonding structures 107 are electrically connected to the plurality of through vias 103. In certain embodiments, the bonding structures 107 are made of copper, copper alloys, or other suitable metal materials. Furthermore, a passivation layer 109 (second passivation layer) is formed to encapsulate the bonding structures 107 and the conductive pad 105. In some embodiments, portions (top surfaces) of the bonding structures 107 are exposed from the passivation layer 109, for hybrid bonding. In certain embodiments, the conductive pad 105 is well protected by the passivation layer 109. In other words, the conductive pad 105 is not revealed from the passivation layer 109. The passivation layer 109 is, for example, made of materials such as polyimide, polybenzoxazole (PBO), benzocyclobutene (BCB), or the like. The disclosure is not limited thereto.

Figure 1D:
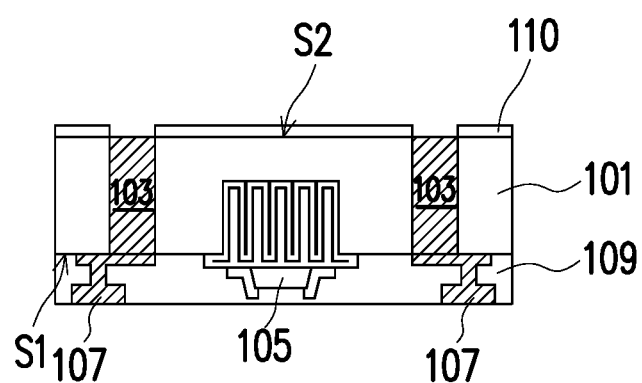

Referring to FIG. 1D, after forming the bonding structures 107 and the passivation layer 109, a height of the substrate layer 101 is reduced so that another portion of the through vias 103 is exposed at the second surface S2 of the substrate layer 101. For example, in some embodiments, the substrate layer 101 is grinded until the through vias 103 are revealed, and that the second surface S2 is coplanar with a surface of the through vias 103. In some embodiments, after the grinding process, a protection layer 110 is formed on the second surface S2 of the substrate layer 101. The protection layer 110 has openings that expose the surface of the through vias 103. In some embodiments, the protection layer 110 may be a polybenzoxazole (PBO) layer, a polyimide (PI) layer or other suitable polymer layer.

Figure 1E:
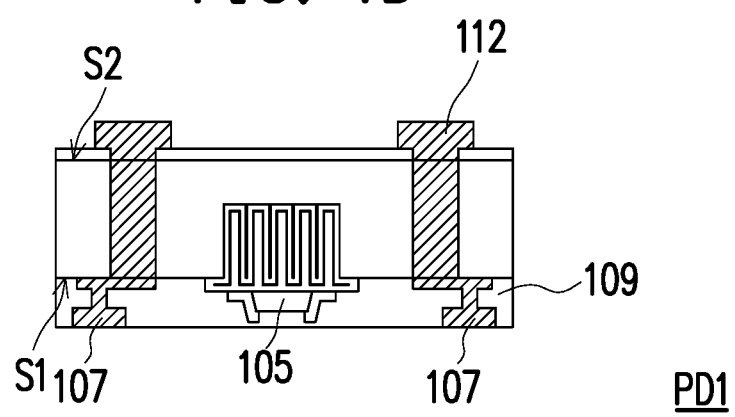

Referring to FIG. 1E, in a next step, a plurality of conductive pillars 112 is formed on the second surface S2 of the substrate layer 101 over the protection layer 110. In some embodiments, the conductive pillars 112 fill into the openings of the protection layer 110, and is electrically connected to the through vias 103. In certain embodiments, the conductive pillars 112 are electrically connected to the bonding structures 107 through the through vias 103. Up to here, an integrated device PD1 according to an embodiment of the disclosure is accomplished.

Figure 2A:
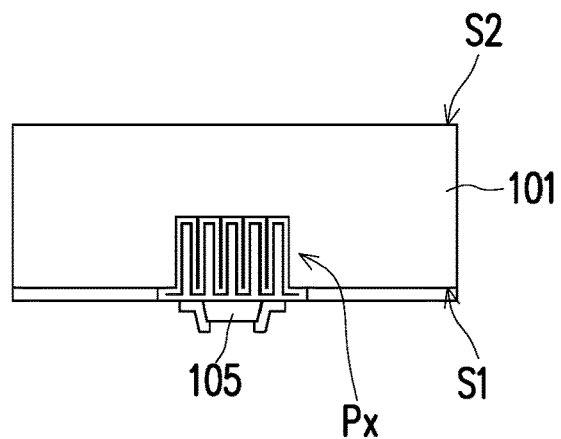
FIG. 2A to FIG. 2C are schematic cross-sectional views of various stages in a method of fabricating an integrated device according to some exemplary embodiments of the present disclosure.
Figure 2B:
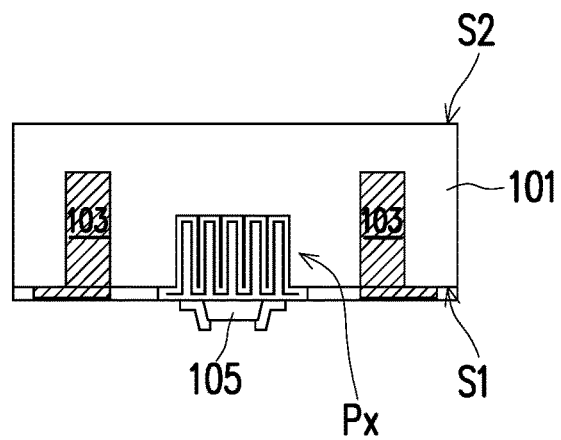
Figure 2C:
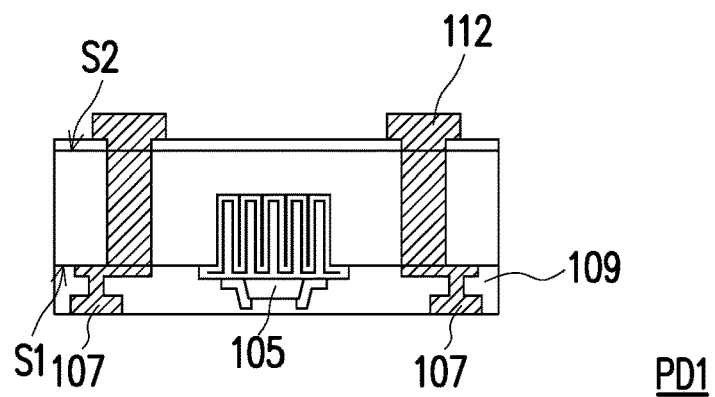

FIG. 2A to FIG. 2C are schematic cross-sectional views of various stages in a method of fabricating an integrated device according to some exemplary embodiments of the present disclosure. In the embodiment shown in FIG. 1A to FIG. 1E, the integrated component Px is formed after the formation of the through vias 103. However, the disclosure is not limited thereto. For example, in the embodiment shown in FIG. 2A to FIG. 2C, the integrated component Px may be formed prior to the formation of the through vias 103. As shown in FIG. 2A, in some embodiments, the integrated component Px is first formed within the substrate layer 101. After forming the integrated component Px, the conductive pad 105 may be formed on the first surface S1 of the substrate layer 101. Referring to FIG. 2B, in a next step, a plurality of through vias 103 is formed in the substrate layer 101 to surround the integrated component Px. Referring to FIG. 2C, the same steps shown in FIG. 1C to FIG. 1E may then be performed to fabricate the integrated device PD1 having bonding structures 107 and conductive pillars 112 located on two sides of the through vias 103.

Figure 3:
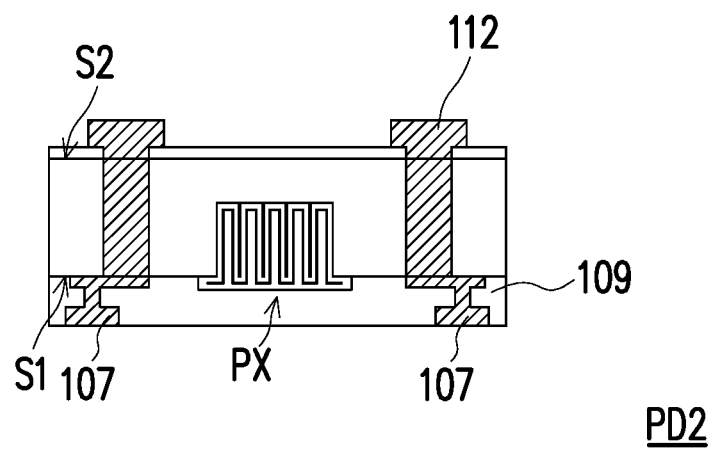
FIG. 3 is a schematic cross-sectional view of an integrated device according to some other exemplary embodiments of the present disclosure.

FIG. 3 is a schematic cross-sectional view of an integrated device according to some other exemplary embodiments of the present disclosure. The integrated device PD2 shown in FIG. 3 is similar to the integrated device PD1 shown in FIG. 1E, hence the same reference numerals are used to refer to the same or liked parts, and its detailed description will be omitted herein. The difference between the embodiment of FIG. 3 and the embodiment of FIG. 1E is that the conductive pad 105 is omitted from the integrated device PD2. In other words, the integrated component Px is exposed form the substrate layer 101, and the passivation layer 109 covers the exposed surface of the integrated component Px and encapsulates the bonding structures 107.

Figure 4A:
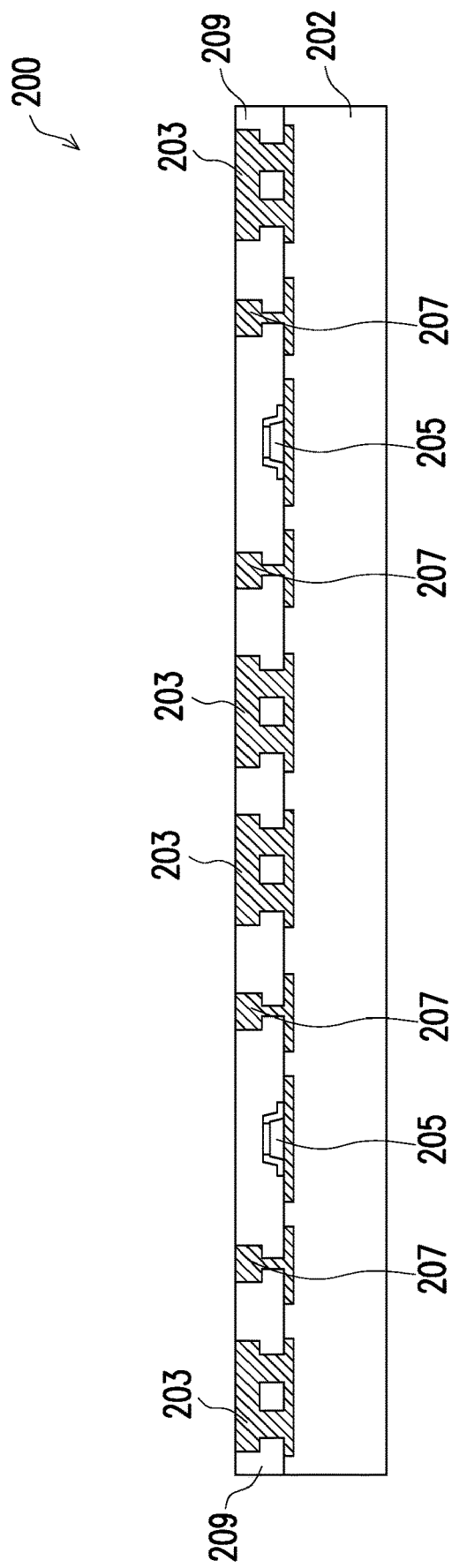
FIG. 4A to FIG. 4G are schematic cross-sectional views of various stages in a method of fabricating a semiconductor chip according to some exemplary embodiments of the present disclosure.

FIG. 4A to FIG. 4G are schematic cross-sectional views of various stages in a method of fabricating a semiconductor chip according to some exemplary embodiments of the present disclosure. Referring to FIG. 4A, a semiconductor wafer 200 is provided. In some embodiments, the semiconductor wafer 200 comprises a die substrate 202, a plurality of conductive elements 203, a plurality of conductive pads 205 (first conductive pads), a plurality of bonding structures 207 (first bonding structures), and a passivation layer 209 (first passivation layer). In some embodiments, the die substrate 202 may be a bulk silicon substrate or a silicon-on-insulator (SOI) substrate, and further includes active components (e.g., transistors or the like) and optionally passive components (e.g., resistors, capacitors, inductors or the like) formed therein. In some embodiments, the conductive elements 203, the conductive pads 205 and the bonding structures 207 are disposed on the die substrate 202, and located on a same surface of the die substrate 202. In some embodiments, the conductive elements 203 and the bonding structures 207 are made of made of copper, copper alloys, or other suitable metal materials. In some embodiments, the conductive pads 205 may be aluminum pads, copper pads or other suitable metal pads. In certain embodiments, the conductive pads 205 may be omitted. In other words, only the conductive elements 203 and the bonding structures 207 are disposed on the die substrate 202.

As shown in FIG. 4A, in some embodiments, the conductive pads 205 may be surrounded by the bonding structures 207. Furthermore, in certain embodiments, the conductive pads 205 and the bonding structures 207 may be surrounded by the conductive elements 203. After providing the conductive elements 203, the conductive pads 205 and the bonding structures 207 on the die substrate 202, a passivation layer 209 is formed over the die substrate 202 to encapsulate these components. For example, the passivation layer 209 covers the conductive elements 203, the conductive pads 205 and the bonding structures 207. In some embodiments, portions (top surface) of the conductive elements 203 and portions (top surface) of the bonding structures 207 are exposed from the passivation layer 209. In certain embodiments, the conductive pad 205 is well protected by the passivation layer 209. In other words, the conductive pad 205 is not revealed from the passivation layer 209. The passivation layer 209 is, for example, made of materials such as polyimide, polybenzoxazole (PBO), benzocyclobutene (BCB), or the like. The disclosure is not limited thereto.

Figure 4B:
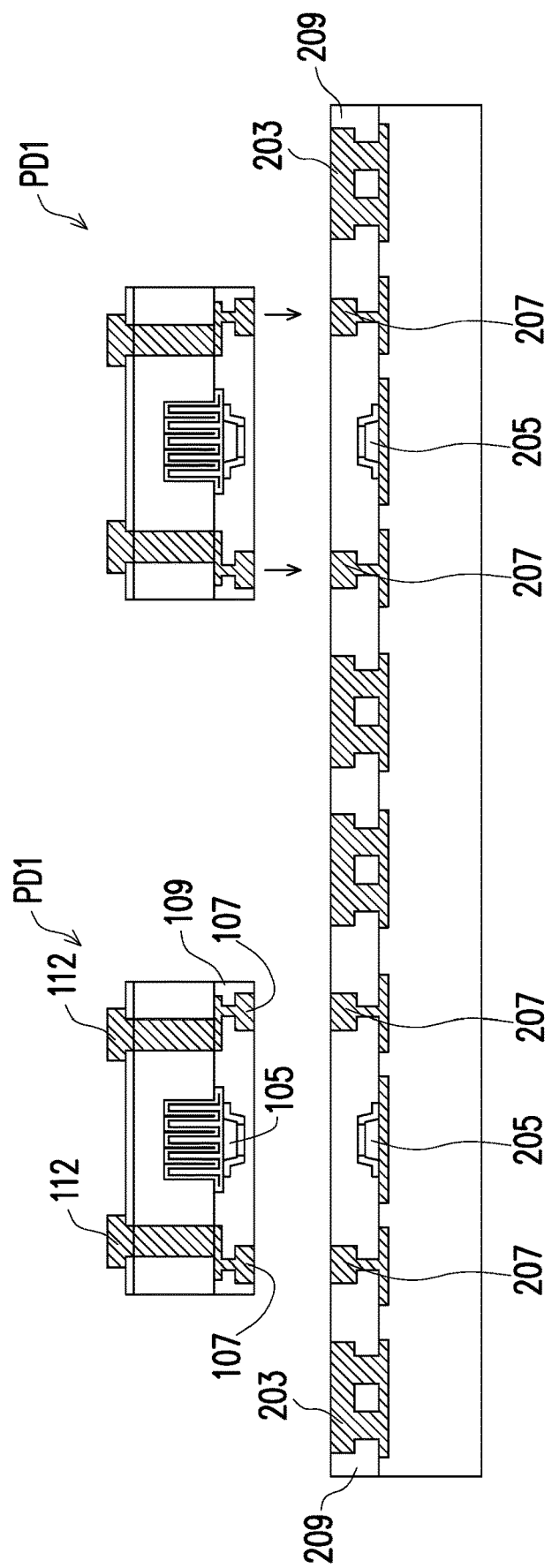

Referring to FIG. 4B, a plurality of integrated devices PD1 formed in the step shown in FIG. 1E is provided, and the integrated devices PD1 are bonded onto the semiconductor wafer 200. In some embodiments, the integrated devices PD1 are bonded on the semiconductor wafer 200 by joining the plurality of bonding structures 107 (second bonding structures) to the plurality of bonding structures 207 (first bonding structures) through hybrid bonding. In some embodiments, the bonding structures 107 contacts the bonding structures 207, and the passivation layer 109 (second passivation layer) contacts the passivation layer 209 (first passivation layer) after hybrid bonding. Furthermore, in some embodiments, the conductive pads 105 (second conductive pads) disposed on the substrate layer 101 is facing the conductive pads 205 (first conductive pads) disposed on the die substrate 202. In certain embodiments, the conductive pads 105 and the conductive pads 205 are separated from one another after hybrid bonding by having the passivation layer 109 and the passivation layer 209 located therebetween. In some alternative embodiments, when the conductive pads 205 are omitted, then the conductive pads 105 on the substrate 101 may also be omitted (integrated device PD2).

Figure 4C:
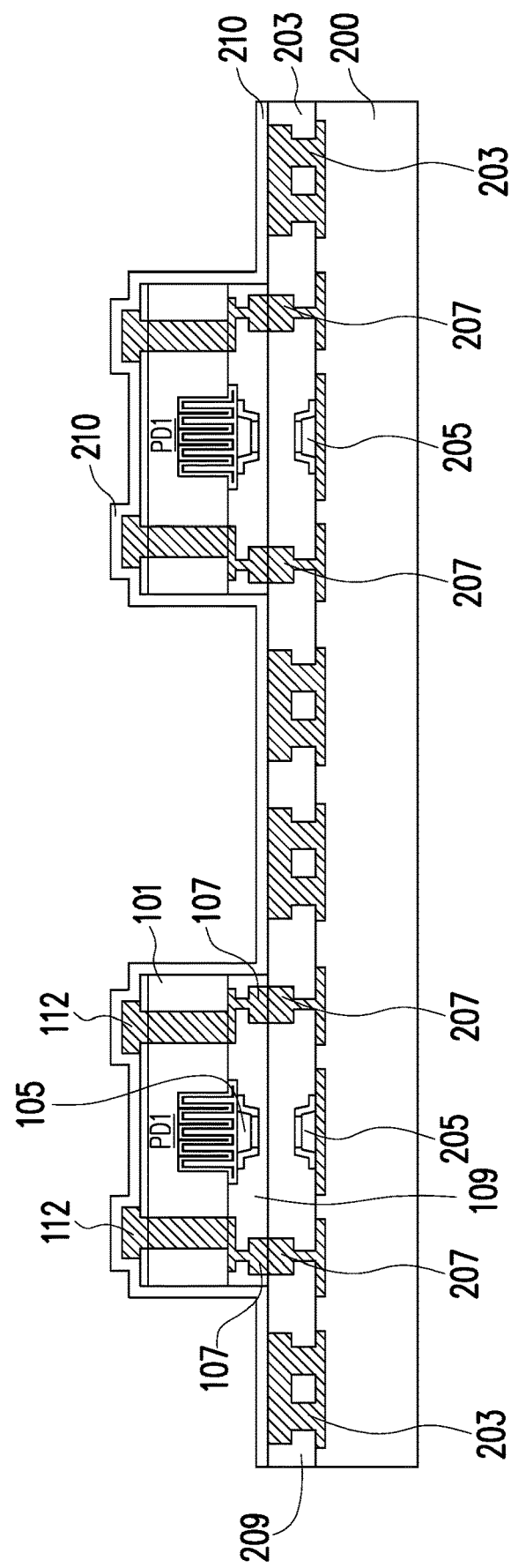

Referring to FIG. 4C, in a next step, a seed layer 210 is conformally formed over the semiconductor wafer 200 and the integrated devices PD1. For example, in one embodiment, the seed layer 210 is conformally formed over the passivation layer 209, the conductive elements 203, and over the substrate layer 101 and conductive pillars 112 of the integrated device PD1. In some embodiments, the seed layer 210 is formed by electroless plating, chemical vapor deposition (CVD), physical vapor deposition (PVD), atomic layer deposition (ALD), high density plasma CVD (HDP-CVD) or combinations thereof. In certain embodiments, the seed layer 210 is formed by sequentially depositing or sputtering a titanium layer and a copper layer.

Figure 4D:
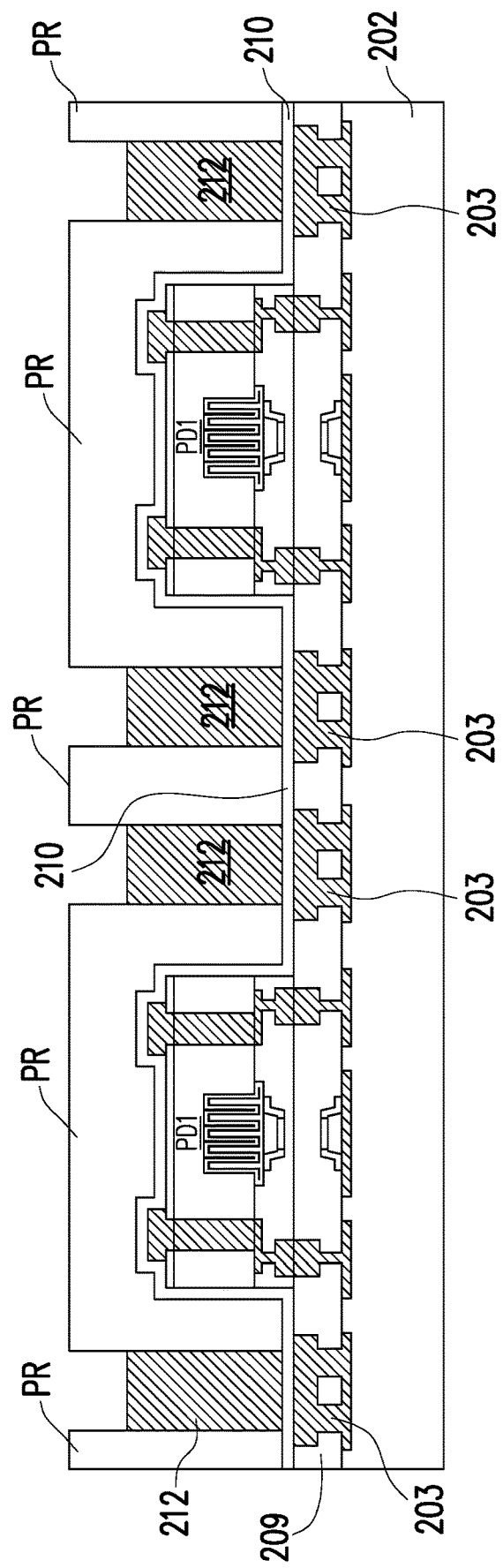

Referring to FIG. 4D, after forming the seed layer 210, a mask pattern PR is formed to cover the integrated device PD1, and over portions of the passivation layer 209. In some embodiments, the mask pattern PR has openings that expose portions of the seed layer 210, and the openings corresponds to a position where the conductive elements 203 are located. Thereafter, a plurality of conductive posts 212 is formed in the openings of the mask pattern PR by electroplating or deposition. In some embodiments, the conductive posts 212 are formed above the conductive elements 203, and being electrically connected to the conductive elements 203. In certain embodiments, the conductive posts 212 are made of materials such as copper, copper alloy or the like.

Figure 4E:
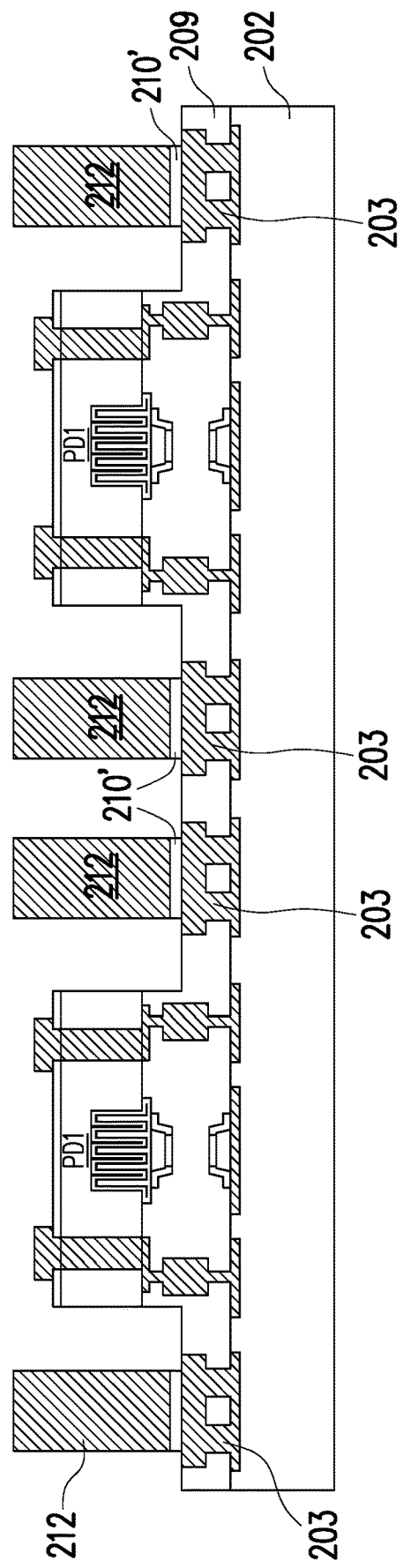

Referring to FIG. 4E, after forming the conductive posts 212, the mask pattern PR is stripped by, for example, etching, ash or other suitable removal processes. In some embodiments, by using the conductive posts 212 as a hard mask, portions of the seed layer 210 that are not covered by the conductive posts 212 are removed through etching until the passivation layer 209 and the integrated device PD1 are exposed. In some embodiments, after removing the mask pattern PR and portions of the seed layer 210, a plurality of seed layers 210' is retained. In certain embodiments, the seed layers 210' are located in between the conductive elements 203 and the conductive posts 212.

Figure 4F:
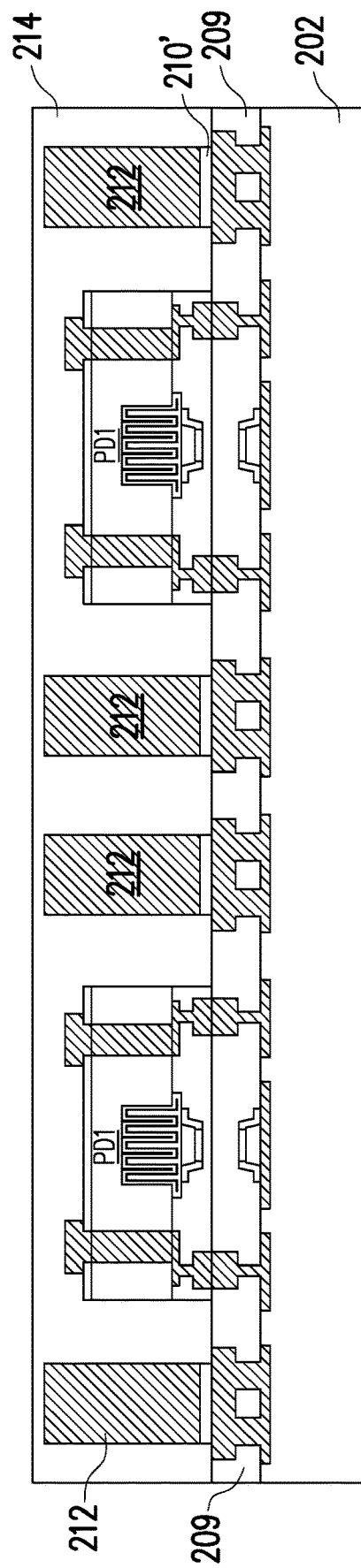

Referring to FIG. 4F, after removing the mask pattern PR and portions of the seed layer 210, a protection layer 214 is formed to encapsulate the integrated device PD1 and the plurality of conductive posts 212. In some embodiments, the protection layer 214 is formed on the passivation layer 209 covering the conductive posts 212 and the integrated device PD1 so as to protect the conductive posts 212 and the integrated device PD1. The protection layer 214 may, for example, be formed of materials such as polyimide (PI), polybenzooxazole (PBO), or any other suitable polymer-based dielectric materials.

Figure 4G:
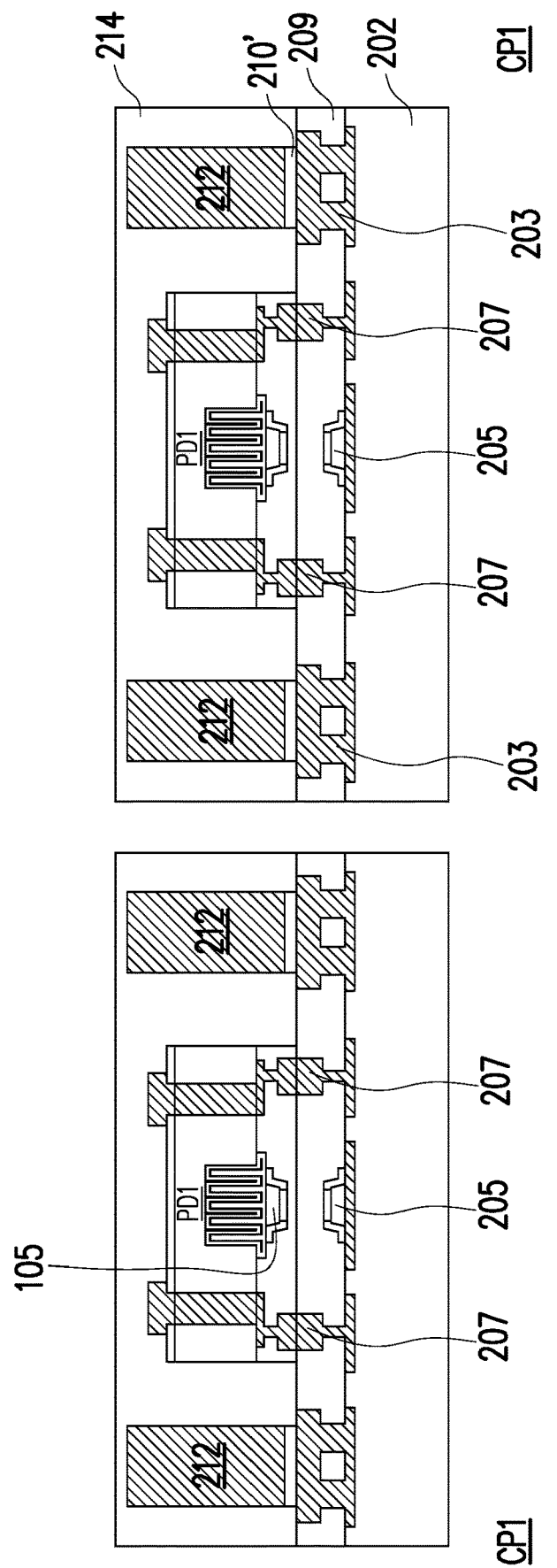

Referring to FIG. 4G, after forming the protection layer 214, a dicing process can be performed to separate the semiconductor wafer 200 into a plurality of semiconductor chips CP1. In the exemplary embodiment, the dicing process is performed by cutting through the protection layer 214, the passivation layer 209 and the die substrate 202 so as to separate the semiconductor chips CP1. In the exemplary embodiment, only one integrated device PD1 is disposed on the die substrate 202 in each of the semiconductor chips CP1. However, the disclosure is not limited thereto. In some other embodiments, two or more integrated devices (either PD1, PD2 or other integrated devices) may be disposed on the die substrate 202 in each of the semiconductor chips. In case where two or more integrated devices are present, the integrated devices may be the same or different, be variable in size, and may include a transistor, a capacitor, an inductor, a resistor or the like as the integrated component Px.

Figure 5:
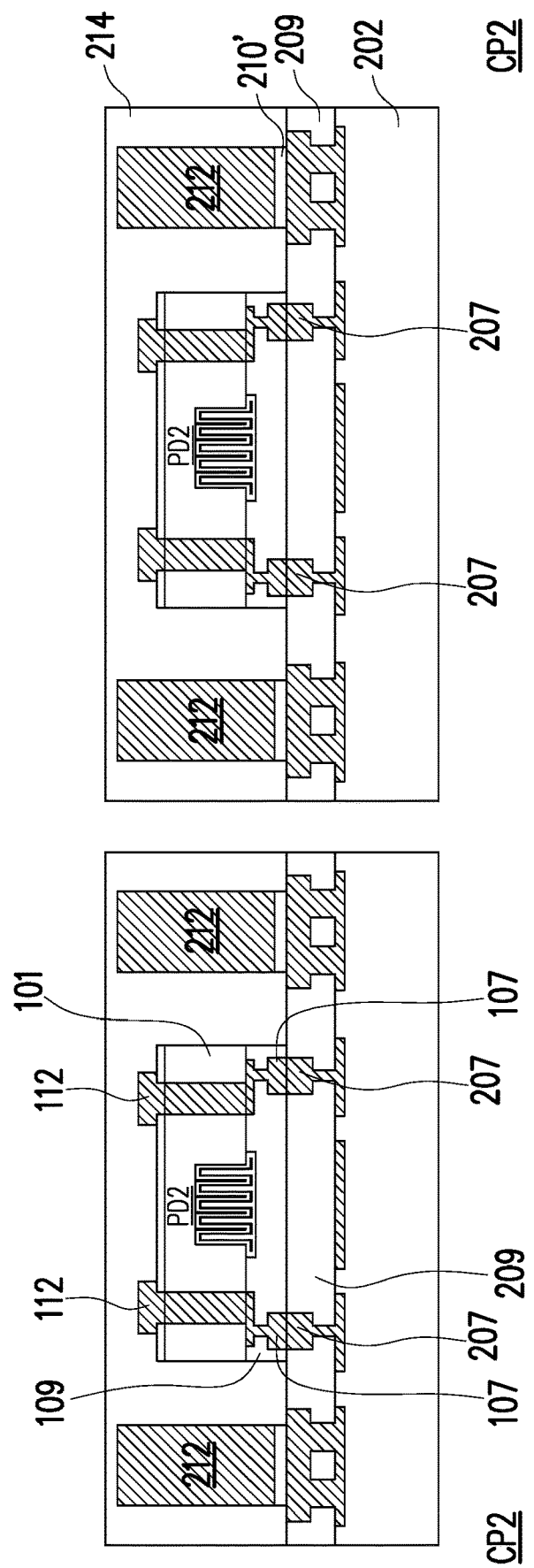
FIG. 5 is a schematic cross-sectional view of a semiconductor chip according to some other exemplary embodiments of the present disclosure.

FIG. 5 is a schematic cross-sectional view of a semiconductor chip according to some other exemplary embodiments of the present disclosure. The semiconductor chip CP2 shown in FIG. 5 is similar to the semiconductor chip CP1 shown in FIG. 4G, hence the same reference numerals are used to refer to the same or liked parts, and its detailed description will be omitted herein. The difference between the embodiment of FIG. 5 and the embodiment of FIG. 4G is that the integrated device PD2 is disposed on the die substrate 202 in replacement of the integrated device PD1. In other words, the conductive pad 105 and conductive pad 205 are omitted from the semiconductor chip CP2.

Figure 6A:
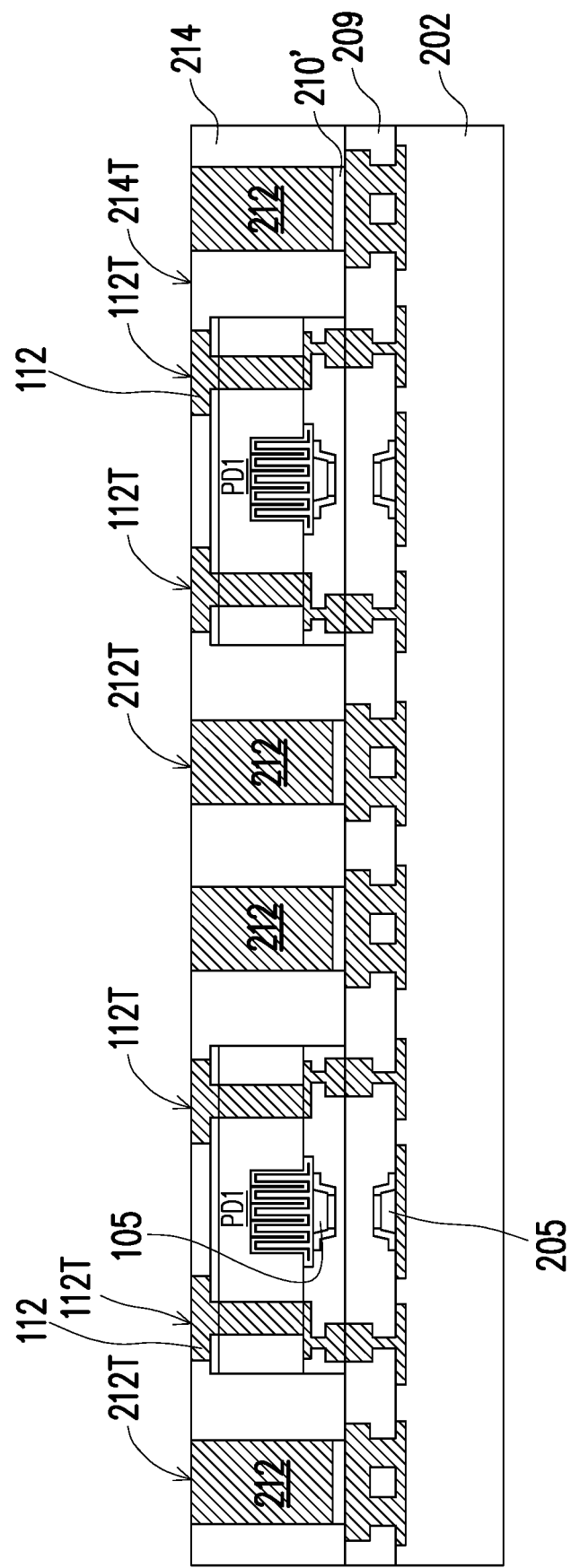
FIG. 6A to FIG. 6C are schematic cross-sectional views of various stages in a method of fabricating a semiconductor chip according to some other exemplary embodiments of the present disclosure.
Figure 6B:
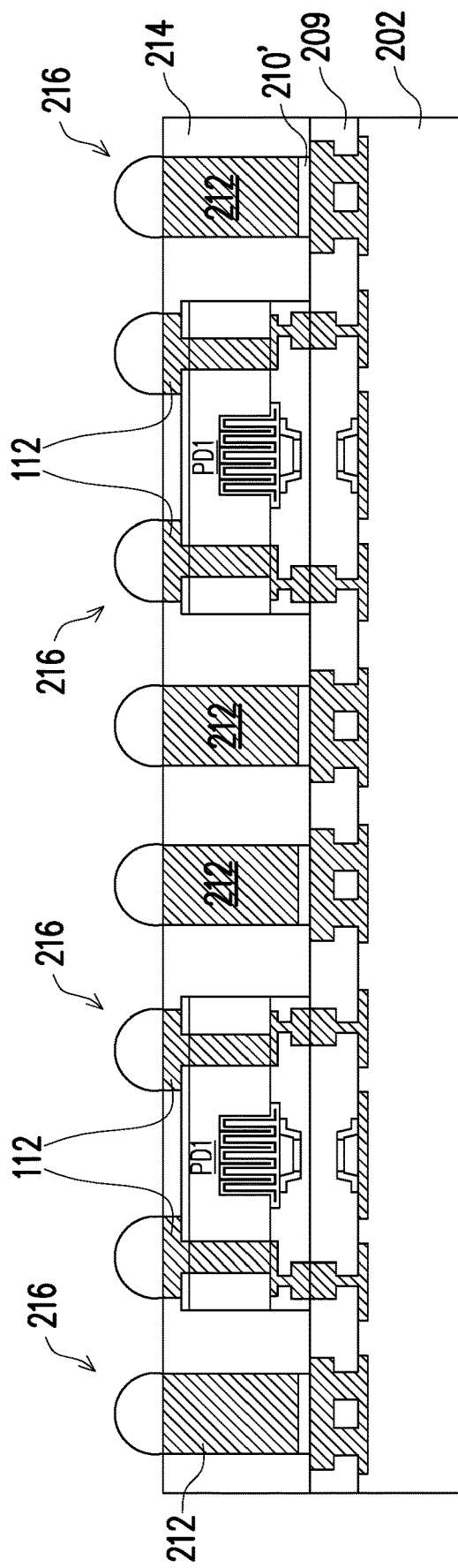
Figure 6C:
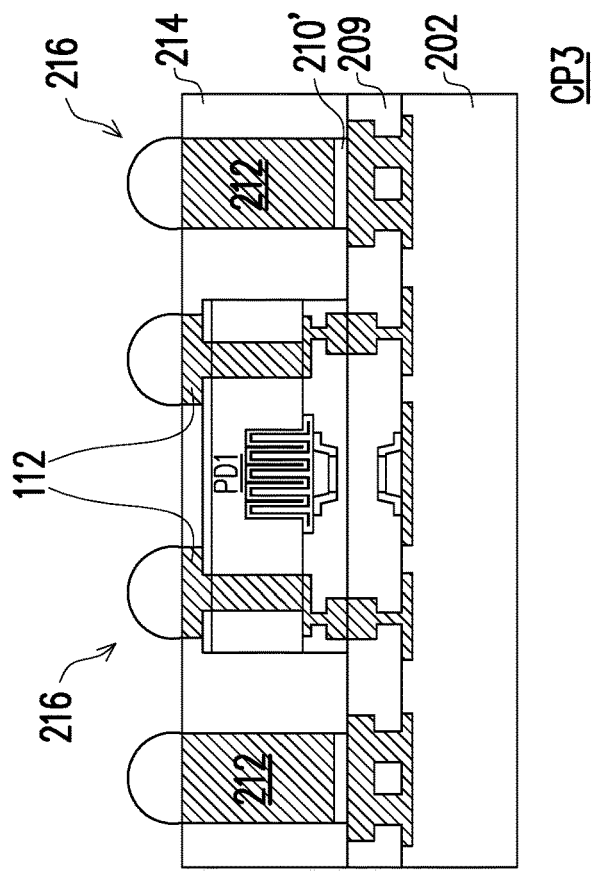
Figure 6C:
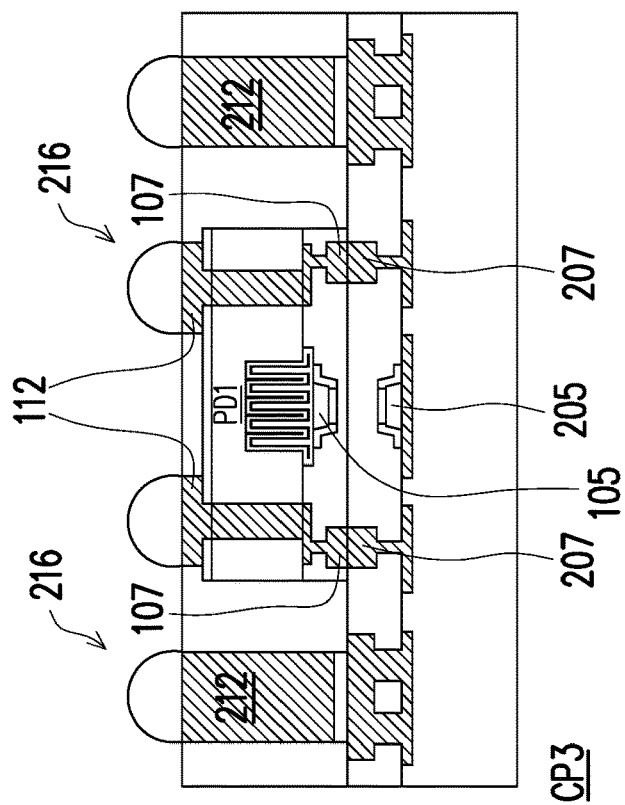

FIG. 6A to FIG. 6C are schematic cross-sectional views of various stages in a method of fabricating a semiconductor chip according to some other exemplary embodiments of the present disclosure. In some embodiments, in order to prepare semiconductor chips used in flip-chip bonding, a plurality of conductive bumps may be further disposed on the semiconductor chips. Referring to FIG. 6A, after the step of forming the protection layer 214 (step shown in FIG. 4F), the protection layer 214 may be ground or polished by a mechanical grinding process and/or a chemical mechanical polishing (CMP) process until the top surfaces 112T of the conductive pillars 112 are revealed. In some embodiments, the conductive posts 212 may be partially polished so that the top surfaces 212T of the conductive posts 212 may be levelled with the top surfaces 112T of the conductive pillars 112. Furthermore, after the grinding/polishing process, the top surface 214T of the protection layer 214 is coplanar with the top surfaces 212T of the conductive posts 212 and the top surfaces 112T of the conductive pillars 112.

Referring to FIG. 6B, in a next step, a plurality of conductive bumps 216 is disposed on the plurality of conductive pillars 112 and the plurality of conductive posts 212. For examples, conductive bumps 216 are disposed on the top surface 112T of the conductive pillars 112 and physically connected to the conductive pillars 112, and further disposed on the top surface 212T of the conductive posts 212 and physically connected to the conductive posts 212. Referring to FIG. 6C, after forming the conductive bumps 216, a dicing process can be performed to separate the semiconductor wafer 200 into a plurality of semiconductor chips CP3. For example, the dicing process is performed by cutting through the protection layer 214, the passivation layer 209 and the die substrate 202 so as to separate the semiconductor chips CP3.

Figure 7:
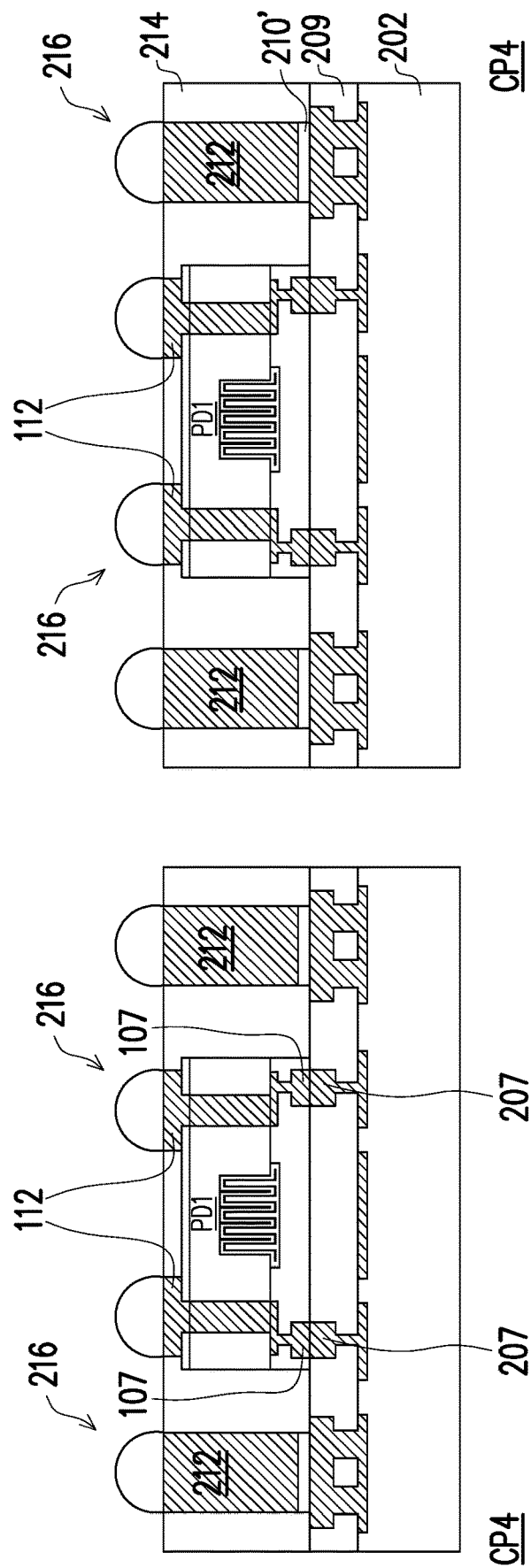
FIG. 7 is a schematic cross-sectional view of a semiconductor chip according to some other exemplary embodiments of the present disclosure.

FIG. 7 is a schematic cross-sectional view of a semiconductor chip according to some other exemplary embodiments of the present disclosure. The semiconductor chip CP4 shown in FIG. 7 is similar to the semiconductor chip CP3 shown in FIG. 6C, hence the same reference numerals are used to refer to the same or liked parts, and its detailed description will be omitted herein. The difference between the embodiment of FIG. 7 and the embodiment of FIG. 6C is that the integrated device PD2 is disposed on the die substrate 202 in replacement of the integrated device PD1. In other words, the conductive pad 105 and conductive pad 205 are omitted from the semiconductor chip CP4.

Figure 8A:
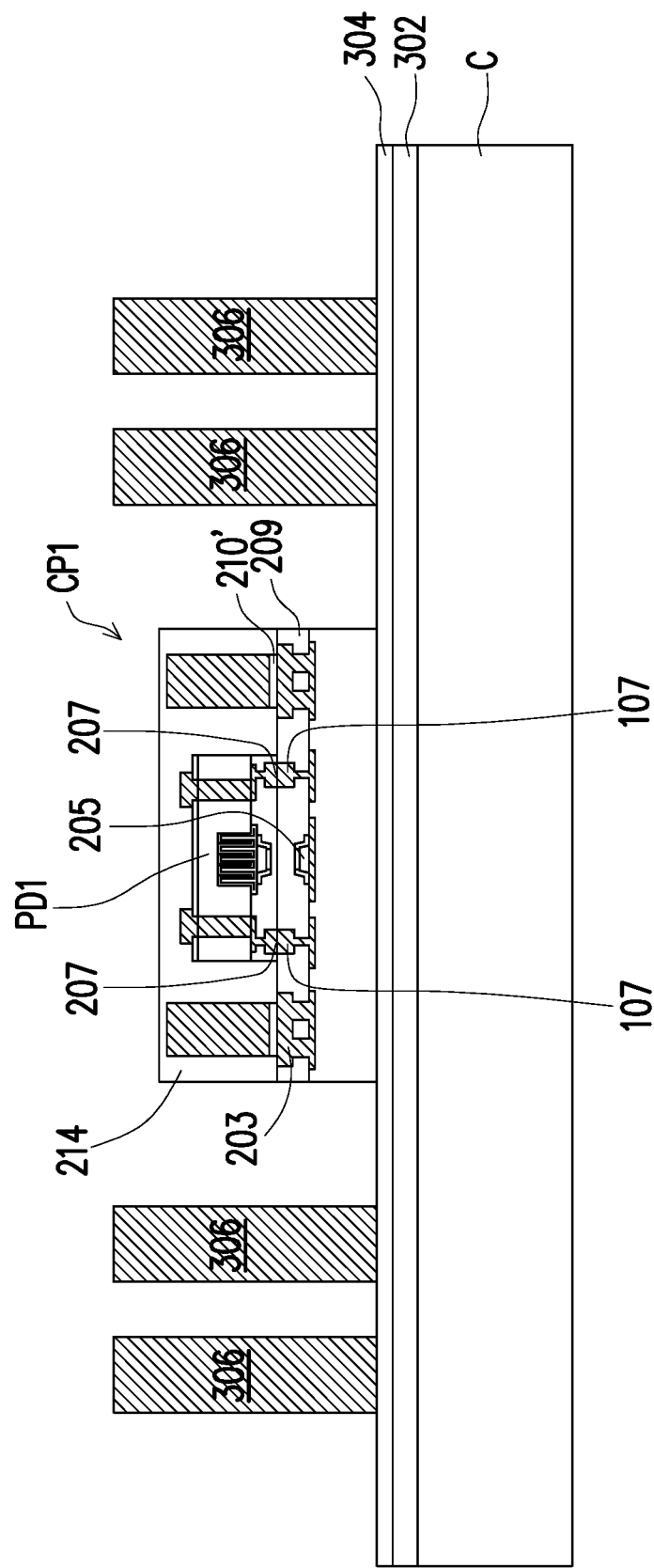
FIG. 8A to FIG. 8F are schematic cross-sectional views of various stages in a method of fabricating a package structure according to some exemplary embodiments of the present disclosure.

FIG. 8A to FIG. 8F are schematic cross-sectional views of various stages in a method of fabricating a package structure according to some exemplary embodiments of the present disclosure. Referring to FIG. 8A, a carrier C having a de-bonding layer 302 and a dielectric layer 304 formed thereon is provided. The de-bonding layer 302 is located in between the carrier C and the dielectric layer 304. In some embodiments, the carrier C may be a glass carrier, a ceramic carrier, or any suitable carrier for carrying a semiconductor wafer or a reconstituted wafer used for the method of fabricating the package structure. In some embodiments, the de-bonding layer 302 may be formed of a polymer-based material (such as a Light to Heat Conversion (LTHC) material), which may be removed along with the carrier C from the overlying structures by applying laser irradiation. In some other embodiments, the de-bonding layer 302 may be formed of an epoxy-based thermal release material.

In the exemplary embodiment, the dielectric layer 304 is formed on the de-bonding layer 302. The dielectric layer 304 may, for example, be made of photo-sensitive dielectric materials such as benzocyclobutene ("BCB"), polybenzoxazole ("PBO"), or any other suitable polymer-based dielectric materials that may be easily patterned using a photolithography process. In some alternative embodiments, the dielectric layer 304 is formed of a nitride such as silicon nitride, an oxide such as silicon oxide, or the like. It is noted that the materials of the carrier C, the de-bonding layer 302 and the dielectric layer 304 are not limited to the descriptions of the embodiments. In some alternative embodiments, the dielectric layer 304 may be omitted; in other words, merely the de-bonding layer 302 is formed over the carrier C.

As shown in FIG. 8A, after forming the de-bonding layer 302 and the dielectric layer 304, a plurality of through insulator vias 306 is formed on the dielectric layer 304 and over the carrier C. In some embodiments, the through insulator vias 306 are through integrated fan-out ("InFO") vias. In one embodiment, the formation of the through insulator vias 306 includes forming a mask pattern (not shown) with openings, then forming a metallic material (not shown) filling up the openings by electroplating or deposition, and removing the mask pattern to form the through insulator vias 306 on the carrier C. In one embodiment, the material of the through insulator vias 306 may include a metal material such as copper or copper alloys, or the like. However, the disclosure is not limited thereto. In an alternative embodiment, the through insulator vias 306 may be formed by forming a seed layer (not shown) on the dielectric layer 304; forming the mask pattern with openings exposing portions of the seed layer; forming the metallic material on the exposed portions of the seed layer to form the through insulator vias 306 by plating; removing the mask pattern; and then removing portions of the seed layer exposed by the through insulator vias 306. For example, the seed layer may be a titanium/copper composited layer.

Furthermore, as illustrated in FIG. 8A, one or more semiconductor chip CP1 may be picked and placed on the dielectric layer 304. The semiconductor chip CP1 formed in FIG. 4G is used as an example in the current embodiment for illustration purposes only. It is noted that the semiconductor chips (such as CP2) formed in other embodiments may be used in forming the package structure. In the exemplary embodiment, the semiconductor chip CP1 is attached or adhered on the dielectric layer 304 through a die attach film (DAF), an adhesion paste (not shown) or the like. In some embodiments, the semiconductor chips CP1 placed on the dielectric layer 304 may be arranged in an array, and when the semiconductor chips CP1 are arranged in an array, the through insulator vias 306 may be classified into groups. The number of the semiconductor chips CP1 may correspond to the number of the groups of the through insulator vias 306. In the illustrated embodiment, the semiconductor chips CP1 may be picked and placed on the dielectric layer 304 after the formation of the through insulator vias 306. However, the disclosure is not limited thereto. In some alternative embodiments, the semiconductor chips CP1 may be picked and placed on the dielectric layer 304 before the formation of the through insulator vias 306.

Figure 8B:
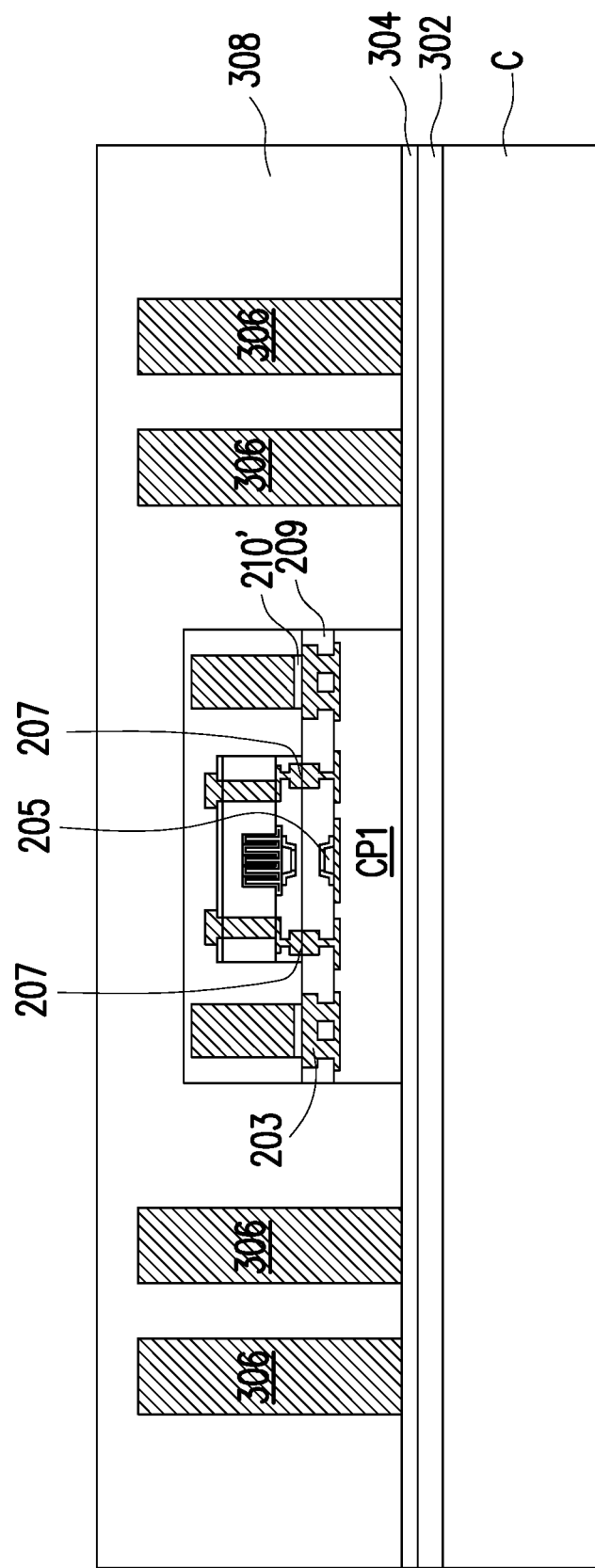

Referring to FIG. 8B, an insulating material 308 is formed on the dielectric layer 304 and over the semiconductor chip CP1. In some embodiments, the insulating material 308 is formed through a compression molding process, filling up the gaps between the semiconductor chip CP1 and the through insulator vias 306, and encapsulating the semiconductor chip CP1. The insulating material 308 also fills up the gaps between adjacent through insulator vias 306 to encapsulate the through insulator vias 306. At this stage, the semiconductor chip CP1 and the through insulator vias 306 are well protected by the insulating material 308.

In some embodiments, the insulating material 308 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 308 may include an acceptable insulating encapsulation material. In some embodiments, the insulating material 308 may further include inorganic filler or inorganic compound (e.g. silica, clay, and so on) which can be added therein to optimize coefficient of thermal expansion (CTE) of the insulating material 308. The disclosure is not limited thereto.

Figure 8C:
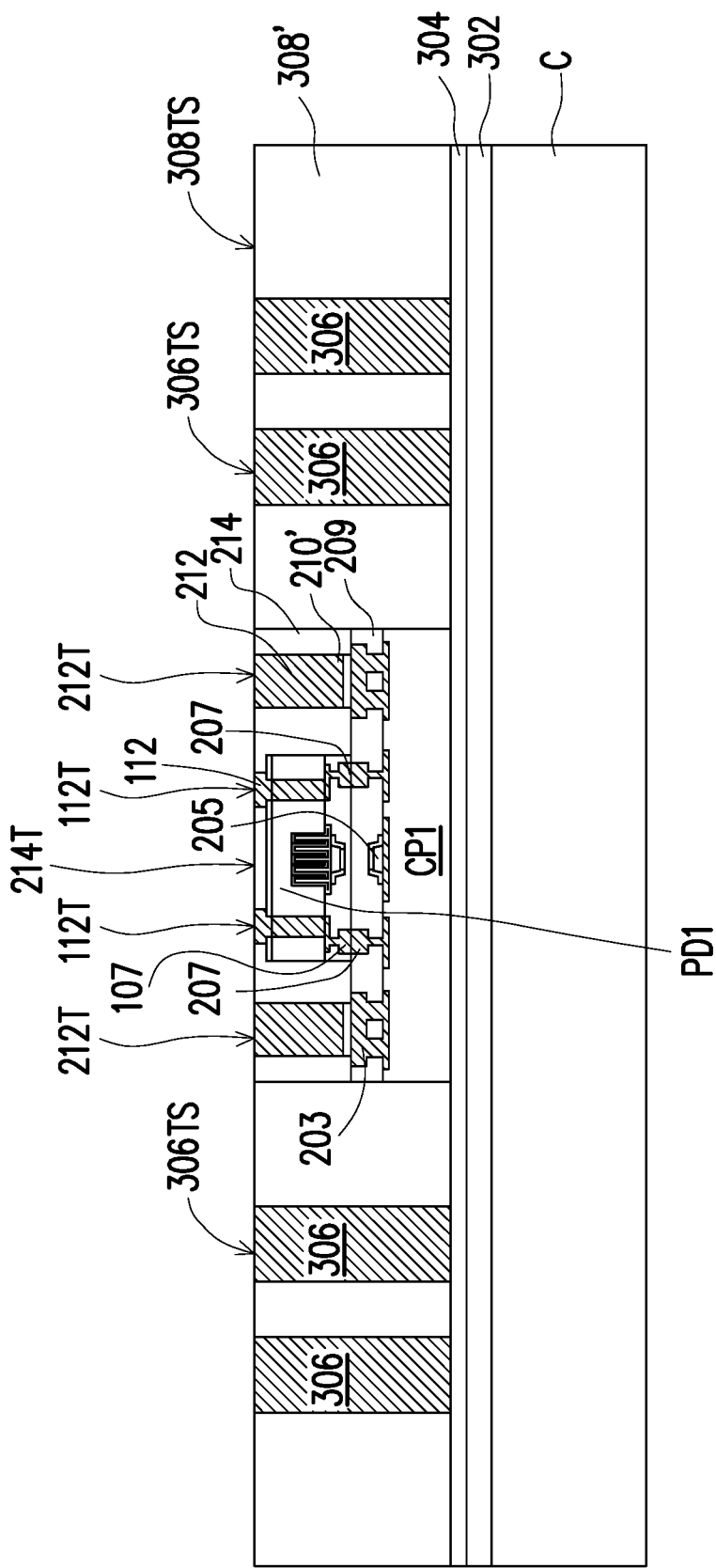

Referring to FIG. 8C, in some embodiments, the insulating material 308 is ground or polished by a mechanical grinding process and/or a chemical mechanical polishing (CMP) process until the top surfaces 112T of the conductive pillars 112 are revealed. In certain embodiment, the conductive posts 212 and the through insulator vias 306 may be partially polished so that the top surfaces 212T of the conductive posts 212 and the top surfaces 306TS of the through insulator vias 306 may be levelled with the top surfaces 112T of the conductive pillars 112.

In the illustrated embodiment, the insulating material 308 is polished to form an insulating encapsulant 308'. In some embodiments, the top surface 214T of the protection layer 214, the top surfaces 212T of the conductive posts 212, the top surfaces 112T of the conductive pillars 112, the top surfaces 306TS of the through insulator vias 306 and the top surface 308TS of the insulating encapsulant 308' are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step.

Figure 8D:
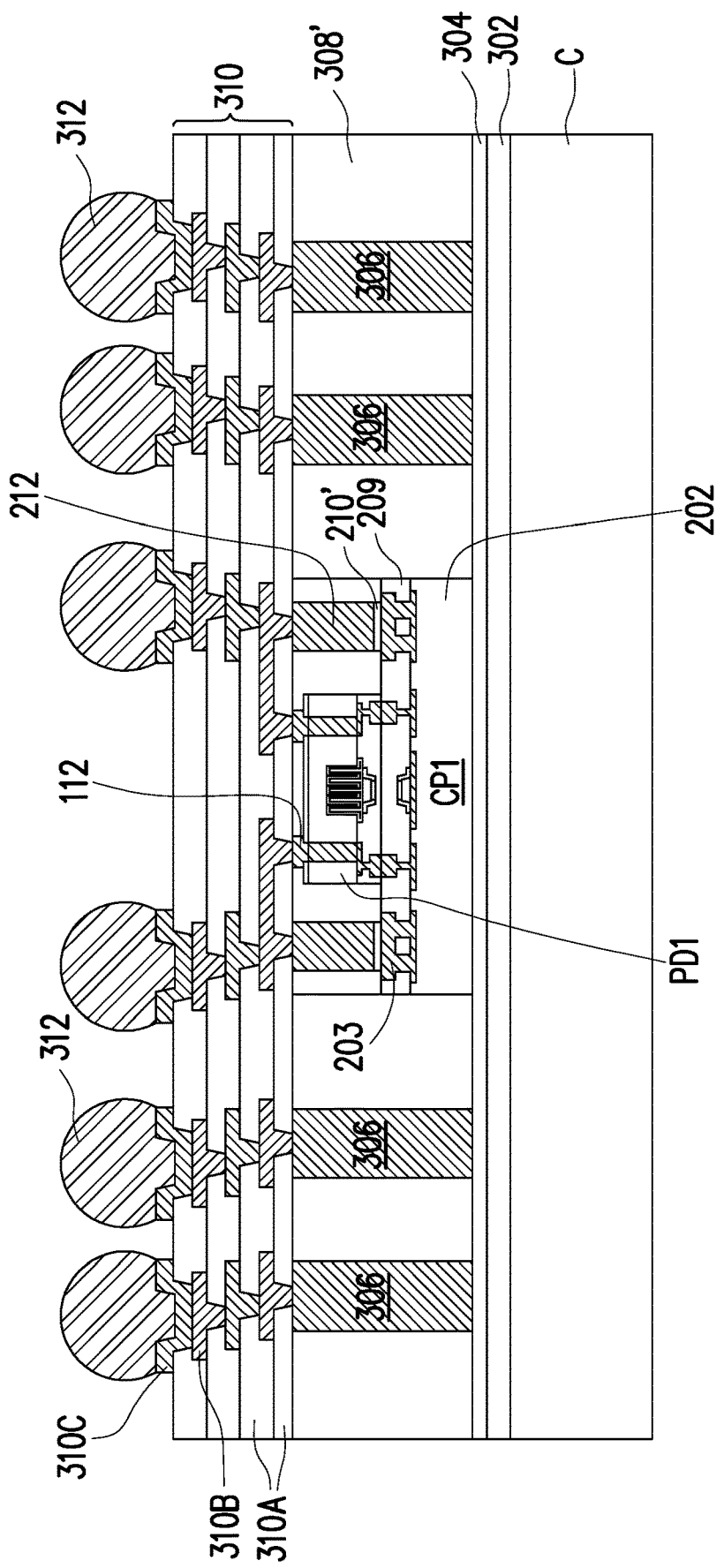

Referring to FIG. 8D, after the planarization step, a redistribution layer 310 is formed on the insulating encapsulant 308', the through insulator vias 306 and over the semiconductor chip CP1. In some embodiments, the redistribution layer 310 is electrically connected to the through insulator vias 306, and electrically connected to the conductive pillars 112 and conductive posts 212 of the semiconductor chip CP1. In some embodiments, the semiconductor chip CP1 is electrically connected to the through insulator vias 306 through the redistribution layer 310. In certain embodiments, at least one integrated device (PD1/PD2) is located in between the die substrate 202 and the redistribution layer 310.

In some embodiments, the formation of the redistribution layer 310 includes sequentially forming one or more dielectric layers 310A, and one or more metallization layers 310B in alternation. In certain embodiments, the metallization layers 310B are sandwiched between the dielectric layers 310A. Although only three layers of the metallization layers 310B and four layers of dielectric layers 310A are illustrated herein, however, the scope of the disclose is not limited by the embodiments of the disclosure. In other embodiments, the number of metallization layers 310B and the dielectric layers 310A may be adjusted based on product requirement. In some embodiments, the metallization layers 310B are electrically connected to the conductive pillars 112 and conductive posts 212 of the semiconductor chip CP1. Furthermore, the metallization layers 310B are electrically connected to the through insulator vias 306.

After forming the redistribution layer 310, a plurality of conductive pads 310C may be disposed on an exposed top surface of the topmost layer of the metallization layers 310B for electrically connecting with conductive balls. In certain embodiments, the conductive pads 310C are for example, under-ball metallurgy (UBM) patterns used for ball mount. In some embodiments, the materials of the conductive pads 310C may include copper, nickel, titanium, tungsten, or alloys thereof or the like, and may be formed by an electroplating process, for example. The number of conductive pads 310C are not limited in this disclosure, and may be selected based on the design layout. In some alternative embodiments, the conductive pads 310C may be omitted. In other words, conductive balls 312 formed in subsequent steps may be directly disposed on the redistribution layer 310.

As illustrated FIG. 8D, after forming the conductive pads 310C, a plurality of conductive balls 312 is disposed on the conductive pads 310C and over the redistribution layer 310. In some embodiments, the conductive balls 312 may be formed on the conductive pads 310C by a ball placement process or reflow process. In some embodiments, the conductive balls 310C are, for example, solder balls or ball grid array (BGA) balls. In certain embodiments, some of the conductive balls 312 may be electrically connected to the through insulator vias 306 through the redistribution layer 310. Furthermore, some of the conductive balls 312 may be electrically connected to the semiconductor chip CP1 though the redistribution layer 310.

Figure 8E:
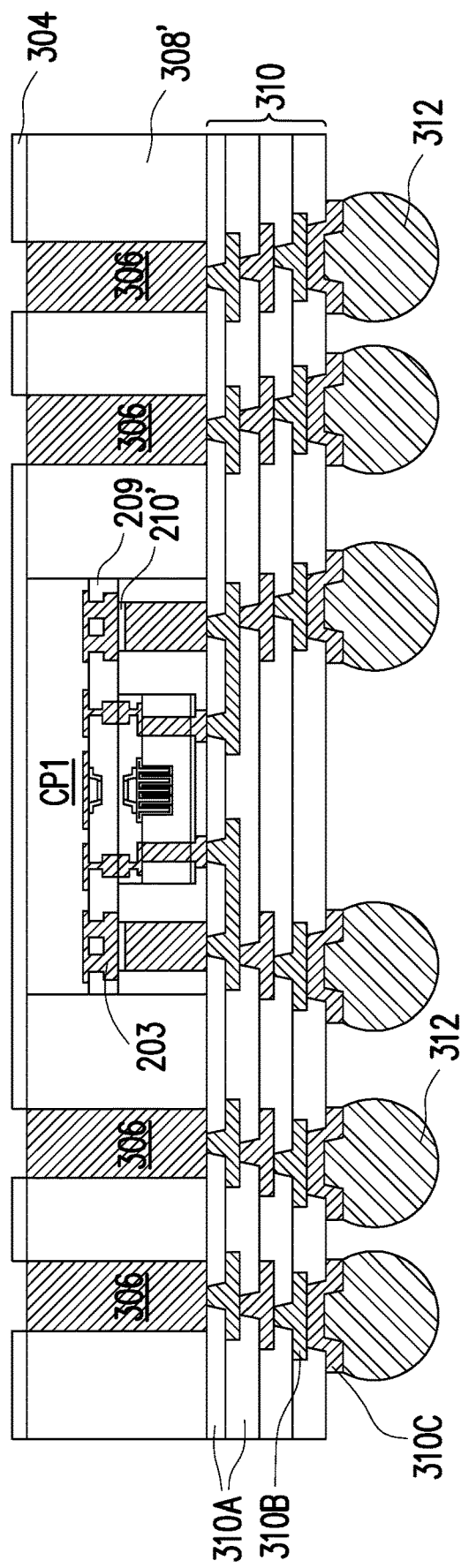

Referring to FIG. 8E, the structure shown in FIG. 8D may be turned upside down and attached to a tape supported by a frame (not shown). Subsequently, the carrier C may be de-bonded so as to separate the semiconductor chip CP1 and the through insulator vias 306 from the carrier C. In the exemplary embodiment, the de-bonding process includes projecting a light such as a laser light or an UV light on the de-bonding layer 302 (e.g., the LTHC release layer), such that the carrier C can be easily removed. In certain embodiments, the de-bonding layer 302 may be further removed or peeled off so that de-bonding layer 302 is separated from the dielectric layer 304. As shown in FIG. 8E, the dielectric layer 304 is then patterned such that a plurality of contact openings is formed to expose the bottom surfaces of the through insulator vias 306. The number of the contact openings is corresponding to the number of the through insulator vias 306.

Figure 8F:
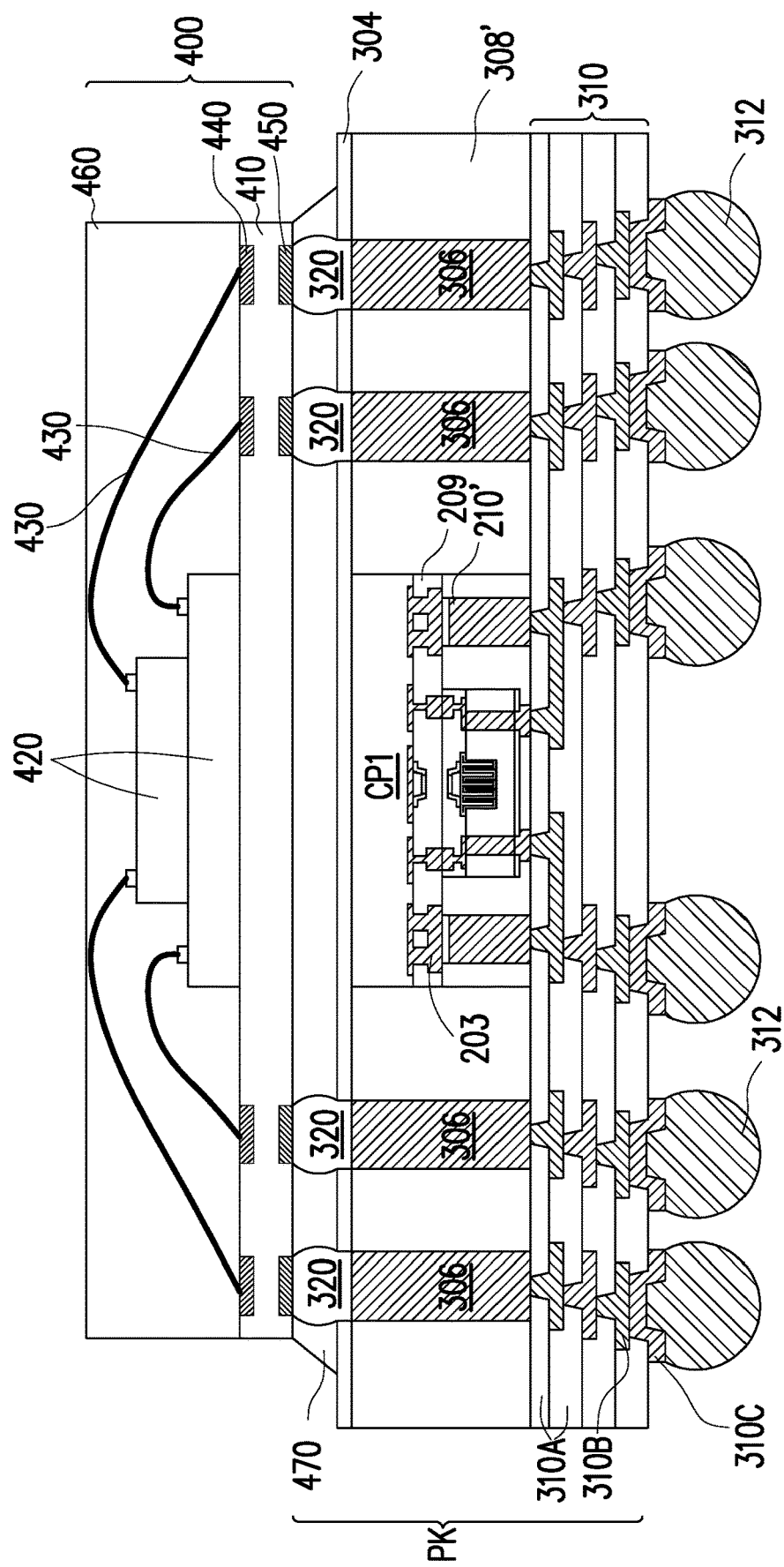

Referring to FIG. 8F, after the contact openings are formed in the dielectric layer 304, a plurality of conductive balls 320 are placed on the bottom surfaces of the through insulator vias 306 exposed by the contact openings. The conductive balls 320 are, for example, reflowed to bond with the bottom surfaces of the through insulator vias 306. After the conductive balls 320 are formed, a package structure PK having dual-side terminals is accomplished. Subsequently, another package 400 may be stacked on the package structure PK so as to form a package-on-package (PoP) structure.

As illustrated in FIG. 8F, the package 400 is electrically connected to the conductive balls 320 of the package structure PK. In some embodiments, the package 400 has a substrate 410, a plurality of semiconductor chips 420 mounted on one surface (e.g. top surface) of the substrate 410 and stacked on top of one another. In some embodiments, bonding wires 430 are used to provide electrical connections between the semiconductor chips 420 and pads 440 (such as bonding pads). In some embodiments, an insulating encapsulant 460 is formed to encapsulate the semiconductor chips 420 and the bonding wires 430 to protect these components. In some embodiments, through insulator vias (not shown) may be used to provide electrical connection between the pads 440 and conductive pads 450 (such as bonding pads) that are located on another surface (e.g. bottom surface) of the substrate 410. In certain embodiments, the conductive pads 450 are electrically connected to the semiconductor chips 420 through these through insulator vias (not shown). In some embodiments, the conductive pads 450 of the package 400 are electrically connected to the conductive balls 320 of the package structure PK. In some embodiments, an underfill 470 is further provided to fill in the spaces between the conductive balls 320 to protect the conductive balls 320. After stacking the package 400 on the package structure PK and providing electrical connection therebetween, a package-on-package structure can be fabricated.

Figure 9A:
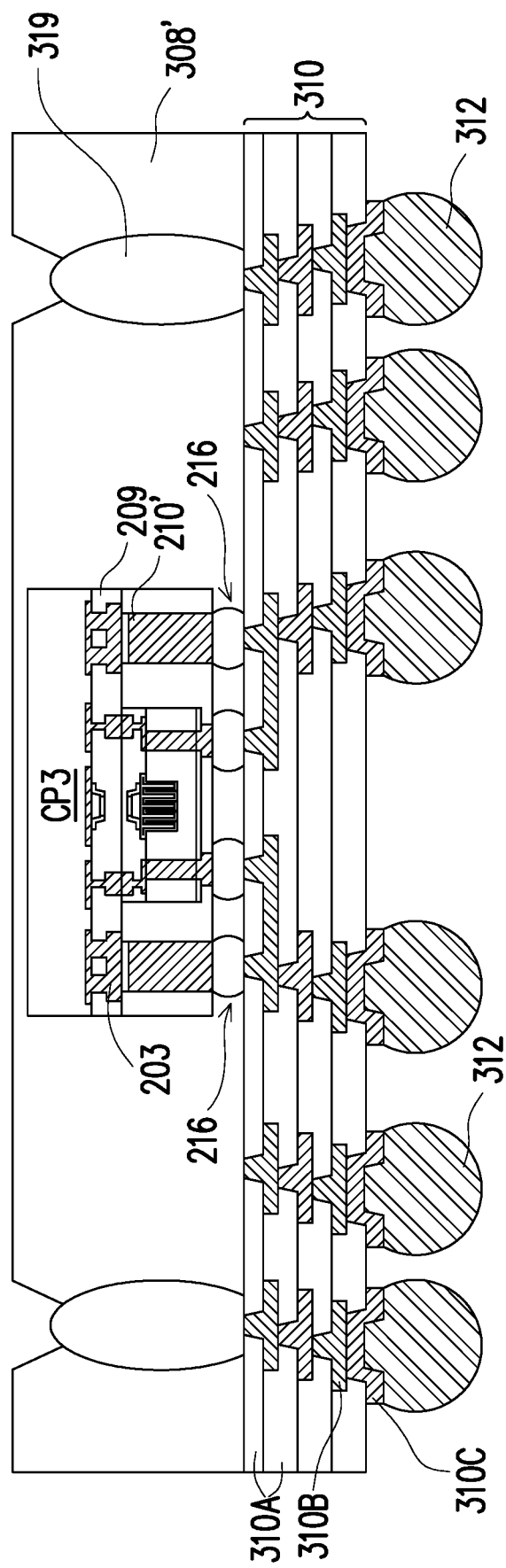
FIG. 9A to FIG. 9B are schematic cross-sectional views of various stages in a method of fabricating a package structure according to some other exemplary embodiments of the present disclosure.
Figure 9B:
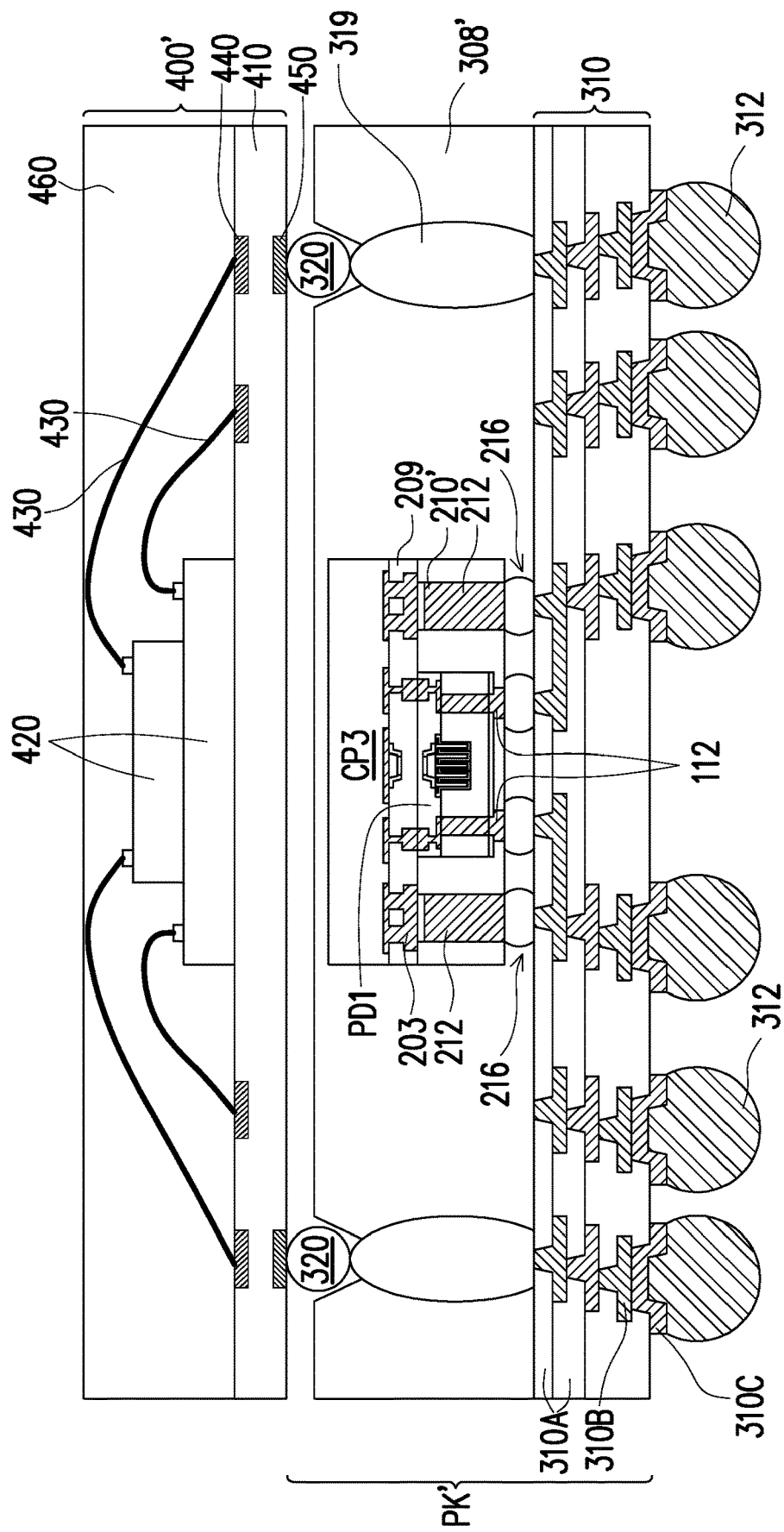

FIG. 9A to FIG. 9B are schematic cross-sectional views of various stages in a method of fabricating a package structure according to some other exemplary embodiments of the present disclosure. The embodiment shown in FIG. 9A to FIG. 9B is similar to the embodiment shown in FIG. 8A to FIG. 8F, hence the same reference numerals are used to refer to the same or liked parts, and its detailed description will not be repeated herein. The difference between the embodiment of FIG. 9A to FIG. 9B and the embodiment of FIG. 8A to FIG. 8F, is that a semiconductor chip CP3 is used in replacement of the semiconductor chip CP1, and the semiconductor chip CP3 is electrically connected to the redistribution layer 310 through flip-chip bonding. In other words, the semiconductor chip CP3 is electrically connected to the redistribution layer 310 through the conductive bumps 216. Furthermore, in the exemplary embodiment, conductive cores 319 are used in replacement of the through insulator vias 306. In some embodiments, the conductive cores 319 are conductive copper cores, but the disclosure is not limited thereto. In certain embodiments, the backside of the insulating encapsulant 308' is patterned to form openings that reveal the conductive core 319, which allows for electrical connection to other components.

Referring to FIG. 9B, after forming the backside openings, a plurality of conductive balls 320 are placed on the bottom surfaces of the conductive core 319 exposed by the openings. Thereafter, a package 400' may be stacked on the package structure PK' to form a package-on-package structure. In the exemplary embodiment, the package 400' is similar to the package 400 described above, hence its detailed description will be omitted herein.

Figure 10:
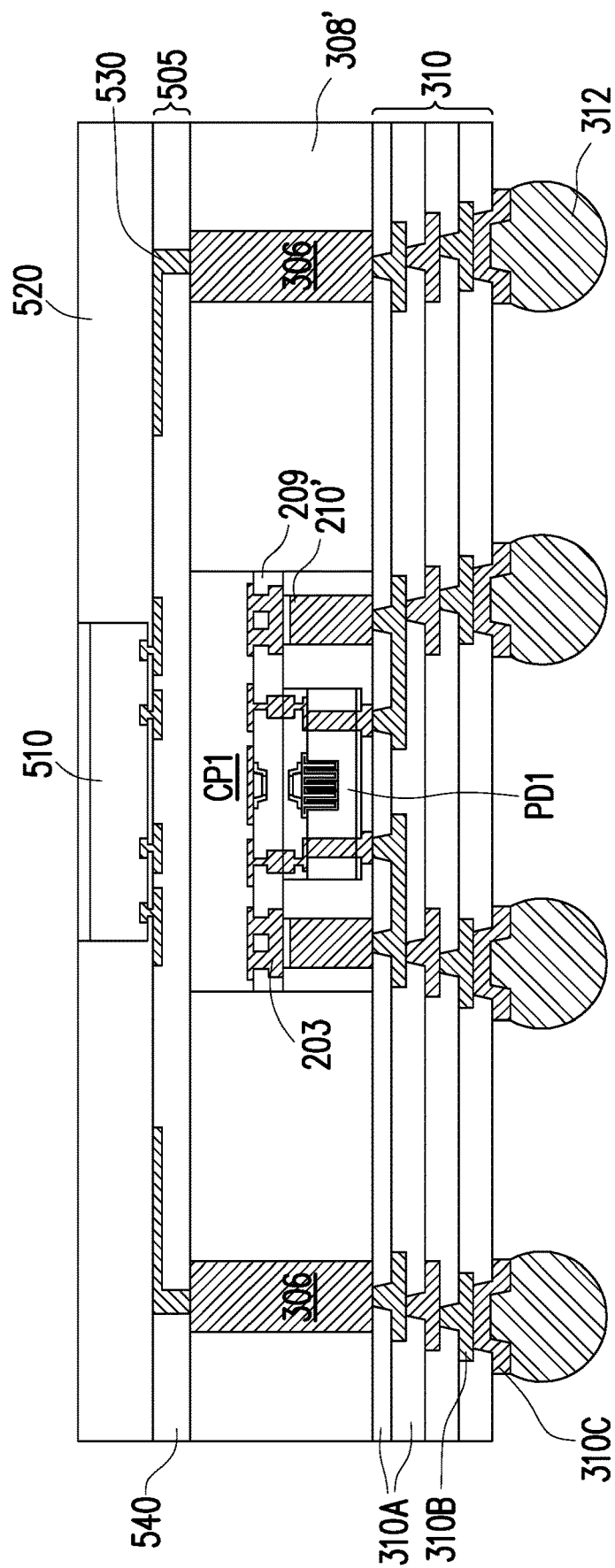
FIG. 10 is a schematic cross-sectional view of a package structure according to some other exemplary embodiments of the present disclosure.

FIG. 10 is a schematic cross-sectional view of a package structure according to some other exemplary embodiments of the present disclosure. The embodiment shown in FIG. 10 is similar to the embodiment shown in FIG. 8F, hence the same reference numerals are used to refer to the same or liked parts, and its detailed description will not be repeated herein. FIG. 10 is an example where the semiconductor chip CP1 of the disclosure is incorporated in an integrated fan-out multi-chip module package (InFO-MCM). In other words, the package 400 is not stacked on the package structure. Instead, a redistribution layer 505 having metallization layers 530 and dielectric layers 540 is provided on the backside of the semiconductor chip CP1. For example, the redistribution layer 310 is located on the active surface of the semiconductor chip CP1, whereas the redistribution layer 505 is located on the backside surface of the semiconductor chip CP1 opposite to the active surface. In some embodiments, redistribution layer 505 is electrically connected to the through insulator vias 306, and electrically connected to the redistribution layer 310 through the through insulator vias 306. In some embodiments, a semiconductor die 510 is formed on the redistribution layer 505 and being electrically connected to the metallization layers 530 of the redistribution layer 505. Furthermore, an insulating encapsulant 520 may be formed over the redistribution layer 505 to protect and encapsulate the semiconductor die 510.

Figure 11:
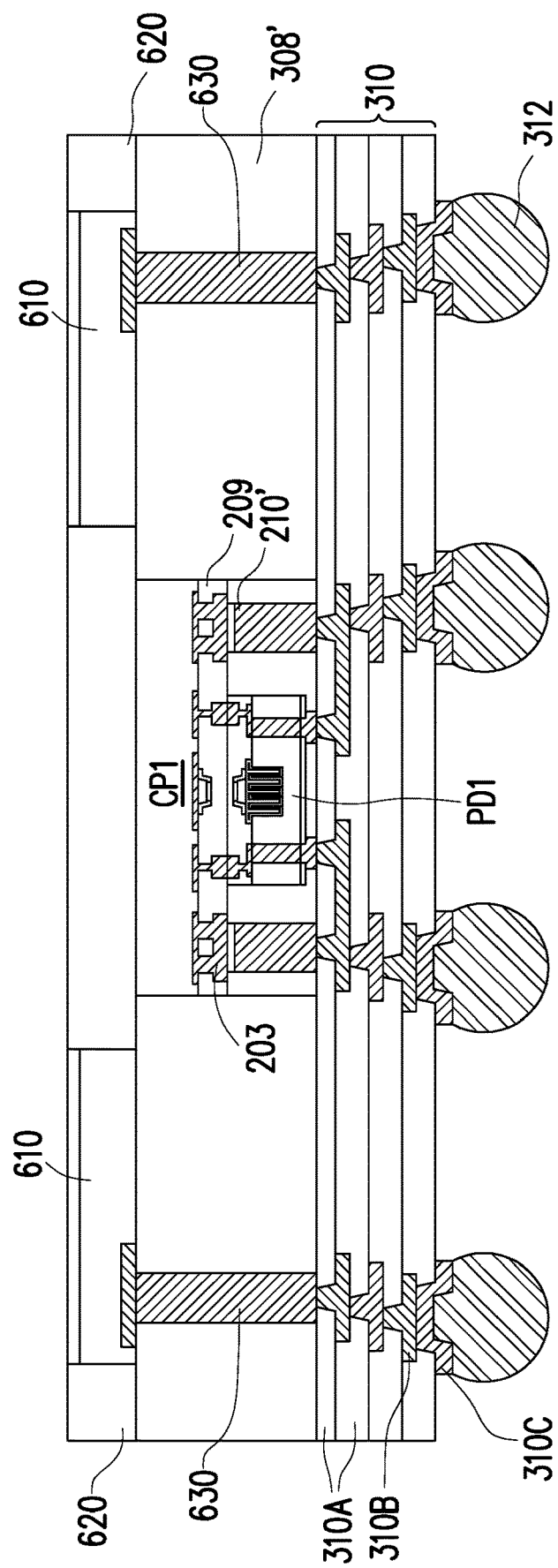
FIG. 11 is a schematic cross-sectional view of a package structure according to some other exemplary embodiments of the present disclosure.

FIG. 11 is a schematic cross-sectional view of a package structure according to some other exemplary embodiments of the present disclosure. The embodiment shown in FIG. 11 is similar to the embodiment shown in FIG. 10, hence the same reference numerals are used to refer to the same or liked parts, and its detailed description will not be repeated herein. The difference being that the redistribution layer 505 is omitted from the package structure shown in FIG. 11, and conductive pillars 630 are used in replacement of the through insulator vias 306. In the exemplary embodiment, two semiconductor dies 610 are disposed on the backside of the semiconductor chip CP1. In certain embodiments, the semiconductor dies 610 are electrically connected to the conductive pillars 630, and electrically connected to the redistribution layer 310 through the conductive pillars 630. Furthermore, in some embodiments, an insulating encapsulant 620 is formed over the backside of the semiconductor chip CP1 to protect and encapsulate the semiconductor dies 610.

Figure 12:
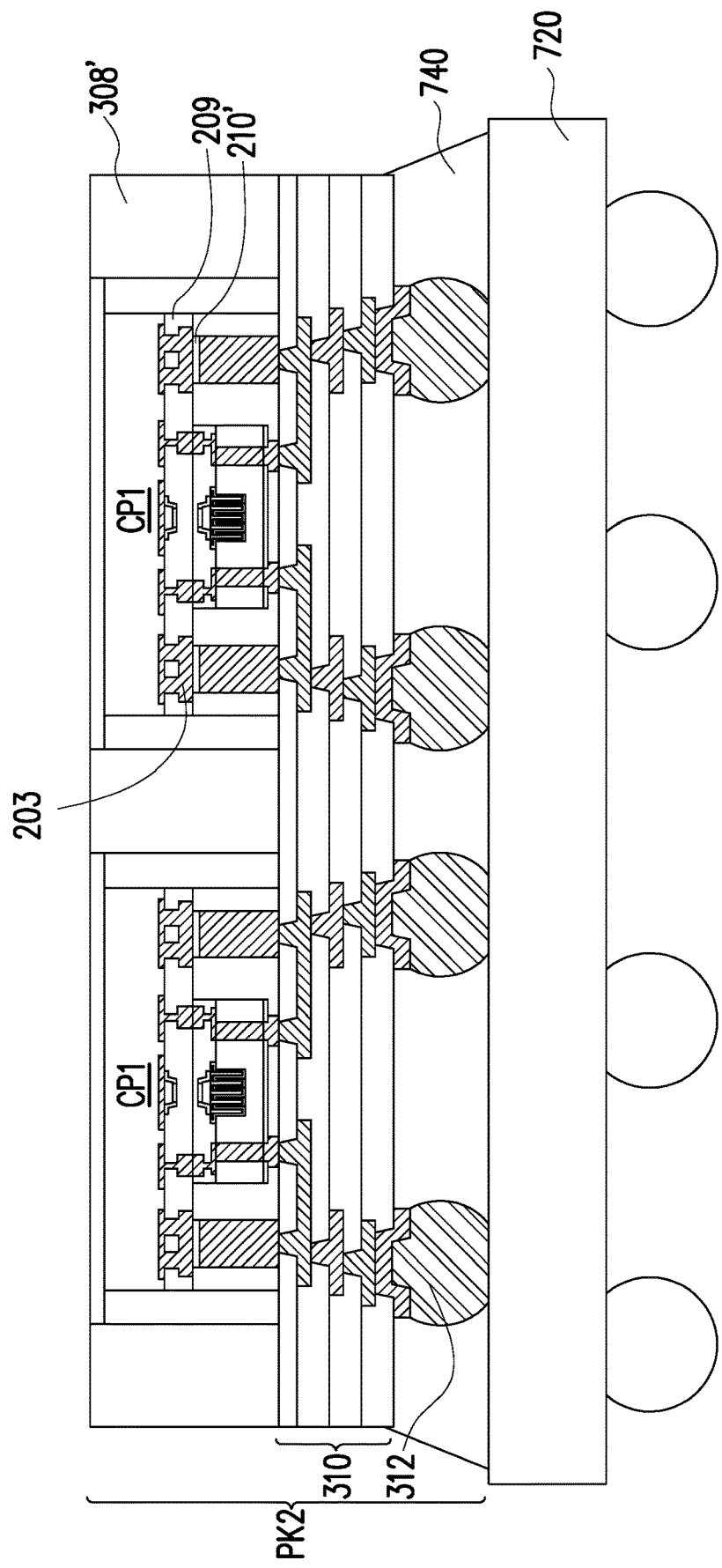
FIG. 12 is a schematic cross-sectional view of a package structure according to some other exemplary embodiments of the present disclosure.

FIG. 12 is a schematic cross-sectional view of a package structure according to some other exemplary embodiments of the present disclosure. The embodiment shown in FIG. 12 is similar to the embodiment shown in FIG. 8F, hence the same reference numerals are used to refer to the same or liked parts, and its detailed description will not be repeated herein. The difference being that two semiconductor chips CP1 are disposed adjacent to one another in the insulating encapsulant 308', and that the through insulator vias 306 are omitted. In the illustrated embodiment, the package structure PK2 is mounted on a circuit substrate 720. For example, in some embodiments, the circuit substrate 720 may be a package substrate, a printed circuit board (PCB), or the like. Furthermore, in some embodiments, the package structure PK2 is electrically connected to the circuit substrate 720 through the conductive balls 312, wherein an underfill 740 may fill in the spaces between the conductive balls 312 to protect the conductive balls 312.

Figure 13:
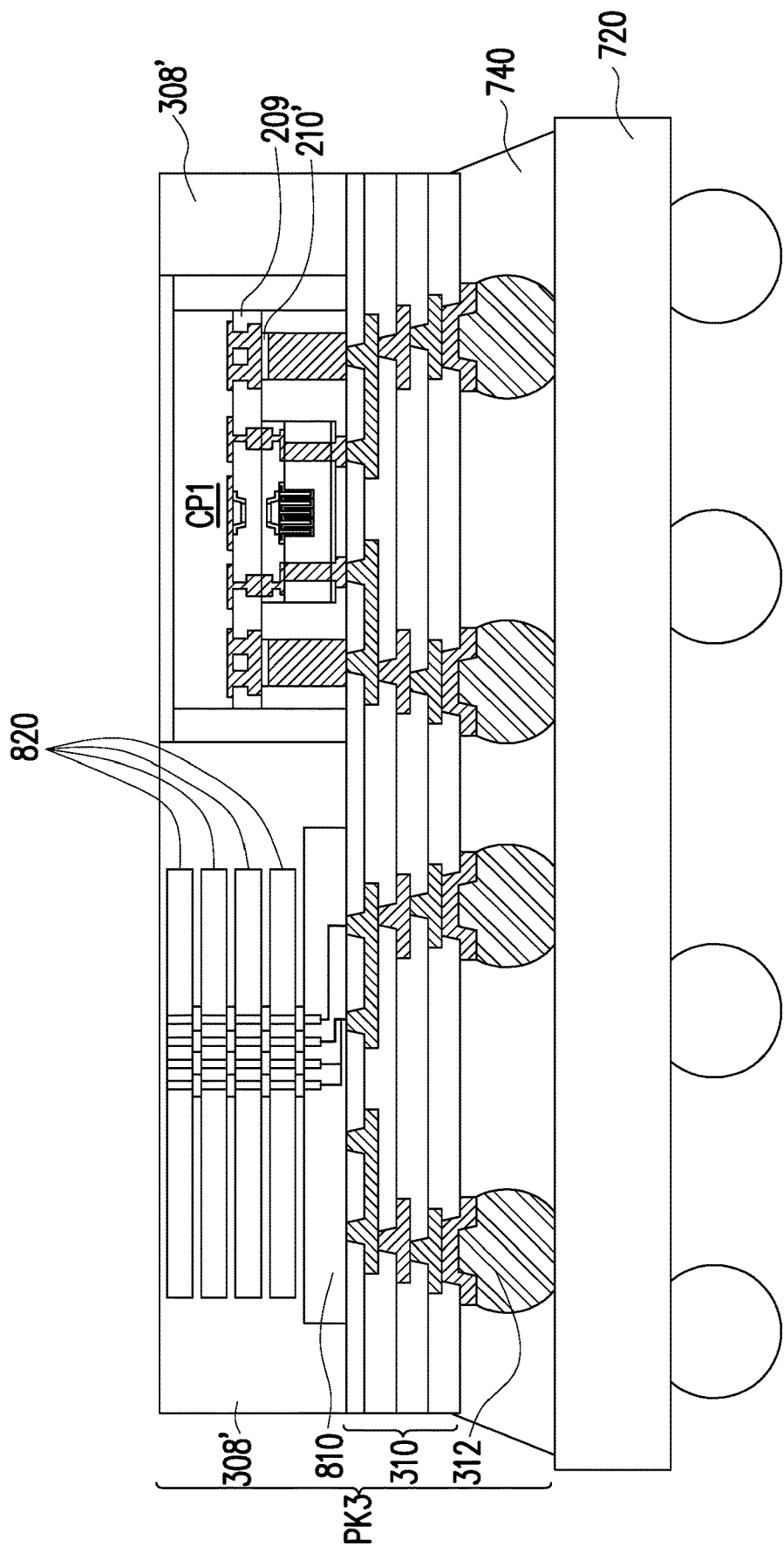
FIG. 13 is a schematic cross-sectional view of a package structure according to some other exemplary embodiments of the present disclosure.

FIG. 13 is a schematic cross-sectional view of a package structure according to some other exemplary embodiments of the present disclosure. The embodiment shown in FIG. 13 is similar to the embodiment shown in FIG. 12, hence the same reference numerals are used to refer to the same or liked parts, and its detailed description will not be repeated herein. The difference being that stacked dies (memory stacking) are disposed adjacent to one of the semiconductor chip CP1. In the exemplary embodiment, the stacked dies comprise a first die 810 electrically connected to the redistribution layer 310, and a plurality of second dies 820 stacked on top of each other over the first die 810. The second dies 820 may be electrically connected to the first die 810 and the redistribution layer 310. In some embodiments, the first die 810 is a logic die, and the second dies 820 are high-bandwidth memory DRAM dies. The disclosure is not limited thereto. In certain embodiments, the package structure PK3 is mounted on the circuit substrate 720, and electrically connected to the circuit substrate 720 through the conductive balls 312. Furthermore, the underfill 740 may fill in the spaces between the conductive balls 312 to protect the conductive balls 312.

In the above embodiments, an integrated device is directly bonded on the semiconductor chips through hybrid bonding. As such, a short interconnect distance can be achieved and a path inductance can be reduced. Furthermore, when such semiconductor chip is incorporated into a package structure, a large capacitance to the semiconductor chips can be provided to improve power integrity performance. Overall, the package structure may have a compact package size and better performance can be achieved.

In some embodiments of the present disclosure, a semiconductor chip including a die substrate, a plurality of first bonding structures, a plurality of conductive elements, at least one integrated device, a plurality of conductive posts and a protection layer is provided. The plurality of first bonding structures is disposed on the die substrate. The plurality of conductive elements is disposed on the die substrate adjacent to the plurality of first bonding structures. The integrated device is disposed on the die substrate over the plurality of first bonding structures, wherein the integrated device includes a plurality of second bonding structures and a plurality of conductive pillars, and the plurality of second bonding structures is hybrid bonded to the plurality of first bonding structures. The plurality of conductive posts is disposed on the plurality of conductive elements and surrounding the integrated device. The protection layer is encapsulating the integrated device and the plurality of conductive posts.

In another embodiment of the present disclosure, a package structure including a semiconductor chip, an insulating encapsulant and a redistribution layer is provided. The semiconductor chip includes a die substrate, a plurality of first bonding structures, a plurality of conductive elements, at least one integrated device, a plurality of conductive posts and a protection layer. The plurality of first bonding structures is disposed on the die substrate. The plurality of conductive elements is disposed on the die substrate adjacent to the plurality of first bonding structures. The integrated device is disposed on the die substrate over the plurality of first bonding structures, wherein the integrated device includes a plurality of second bonding structures and a plurality of conductive pillars, and the plurality of second bonding structures is hybrid bonded to the plurality of first bonding structures. The plurality of conductive posts is disposed on the plurality of conductive elements and surrounding the integrated device. The protection layer is encapsulating the integrated device and the plurality of conductive posts. The insulating encapsulant is encapsulating the semiconductor chip. The redistribution layer is disposed on the semiconductor chip and the insulating encapsulant, wherein the redistribution layer is electrically connected to the plurality of conductive pillars of the integrated device and electrically connected the plurality of conductive posts.

In yet another embodiment of the present disclosure, a method of fabricating a semiconductor chip is described. The method includes the following steps. A semiconductor is provided. The semiconductor wafer includes a die substrate, a plurality of first bonding structures disposed on the die substrate, and a plurality of conductive elements disposed on the die substrate adjacent to the plurality of first bonding structures. A plurality of integrated devices is provided, wherein each of the integrated devices comprise a plurality of second bonding structures and a plurality of conductive pillars. The integrated devices are bonded on the semiconductor wafer by joining the plurality of second bonding structures to the plurality of first bonding structures through hybrid bonding. A plurality of conductive posts is formed on the plurality of conductive elements, wherein the plurality of conductive posts surround the integrated devices. A protection layer is formed to encapsulate the integrated device and the plurality of conductive posts. A dicing process is performed to separate the semiconductor wafer into a plurality of semiconductor chips.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor chip, comprising:
   a die substrate;
   a plurality of first bonding structures disposed on the die substrate;
   a first passivation layer disposed on the die substrate and encapsulating the plurality of first bonding structures, wherein a top surface of the first passivation layer is coplanar with a top surface of the plurality of first bonding structures;
   at least one integrated device disposed on the die substrate over the plurality of first bonding structures, wherein the integrated device comprises a plurality of second bonding structures and a second passivation layer encapsulating the second bonding structures, and a bottom surface of the second passivation layer is coplanar with a bottom surface of the plurality of second bonding structures, and the plurality of second bonding structures is in physical contact with the plurality of first bonding structures, and wherein the first passivation layer is in physical contact with the second passivation layer, and an interface where the first passivation layer contacts the second passivation layer is aligned with an interface where the plurality of second bonding structures contacts the plurality of first bonding structures; and
   a protection layer disposed on the first passivation layer and encapsulating the integrated device.

2. The semiconductor chip according to claim 1, wherein the integrated device further comprises:
   a substrate layer having a first surface and a second surface opposite to the first surface;
   a capacitor embedded in the substrate layer;
   the plurality of second bonding structures is located on the first surface of the substrate layer and encapsulated by the second passivation layer;
   a plurality of conductive pillars located on the second surface of the substrate layer; and
   a plurality of through vias located in the substrate layer and electrically connecting the plurality of second bonding structures to the plurality of conductive pillars.

3. The semiconductor chip according to claim 2, wherein the semiconductor chip further comprises a plurality of first conductive pads disposed on the die substrate adjacent to the plurality of first bonding structures.

4. The semiconductor chip according to claim 3, wherein the integrated device further comprises a plurality of second conductive pads disposed on the first surface of the substrate layer adjacent to the plurality of second bonding structures, and the plurality of second conductive pads is facing the plurality of first conductive pads.

5. The semiconductor chip according to claim 2, further comprising a plurality of conductive bumps disposed on the plurality of conductive pillars.

6. The semiconductor chip according to claim 1, further comprising:
   a plurality of conductive elements embedded in the protection layer;
   a plurality of conductive posts embedded in the second passivation layer; and
   seed layers sandwiched between the plurality of conductive elements and the plurality of conductive posts.

7. The semiconductor chip according to claim 6, further comprising a plurality of conductive bumps disposed on the plurality of conductive posts.

8. A package structure, comprising:
a semiconductor chip, the semiconductor chip comprises:
a die substrate;
a plurality of first bonding structures disposed on the die substrate;
an integrated device disposed on the die substrate over the plurality of first bonding structures, wherein the integrated device comprises a plurality of second bonding structures and a plurality of conductive pillars, the plurality of second bonding structures is joined and in contact with the plurality of first bonding structures and the plurality of conductive pillars is electrically connected to the plurality of second bonding structures; and
a protection layer disposed on the die substrate and encapsulating the integrated device, wherein sidewalls of the protection layer are aligned with sidewalls of the die substrate;
an insulating encapsulant encapsulating the semiconductor chip;
a plurality of through insulator vias embedded in the insulating encapsulant and surrounding the semiconductor chip, wherein a top surface of the plurality of through insulator vias is coplanar with a top surface of the plurality of conductive pillars; and
a redistribution layer disposed on the insulating encapsulant and electrically connected to the semiconductor chip and the plurality of through insulator vias.

9. The package structure according to claim 8, wherein the semiconductor chip further comprises a plurality of first conductive pads disposed on the die substrate adjacent to the plurality of first bonding structures.

10. The package structure according to claim 9, wherein the integrated device further comprises a plurality of second conductive pads disposed adjacent to the plurality of second bonding structures, and the plurality of second conductive pads is facing the plurality of first conductive pads.

11. The package structure according to claim 8, wherein the semiconductor chip further comprises a plurality of conductive posts embedded in the protection layer, and a top surface of the plurality of conductive posts is coplanar with the top surface of the plurality of through insulator vias and the top surface of the plurality of conductive pillars.

12. The package structure according to claim 8, wherein the integrated device further comprises:
a substrate layer having a first surface and a second surface opposite to the first surface;
a capacitor embedded in the substrate layer;
the plurality of second bonding structures is located on the first surface of the substrate layer;
the plurality of conductive pillars is located on the second surface of the substrate layer; and
a plurality of through vias located in the substrate layer and electrically connecting the plurality of second bonding structures to the plurality of conductive pillars.

13. The package structure according to claim 8, further comprising:
a second redistribution layer located on a backside of the insulating encapsulant opposite to the redistribution layer, wherein the second redistribution layer is electrically connected to the plurality of through insulator vias; and a semiconductor die disposed on the second redistribution layer and electrically connected to the second redistribution layer.

14. The package structure according to claim 13, further comprising:
a second insulating encapsulant disposed on the second redistribution layer and encapsulating the semiconductor die, wherein sidewalls of the second insulating encapsulant is aligned with sidewalls of the insulating encapsulant.

15. A package-on-package structure, comprising:
a package structure, wherein the package structure comprises:
a semiconductor chip, the semiconductor chip comprises:
a die substrate;
an integrated device disposed on the die substrate, wherein the integrated device includes a substrate layer, a capacitor embedded in the substrate layer, a plurality of through vias located in the substrate layer, and a plurality of conductive pillars located on the substrate layer and electrically connected to the plurality of through vias;
a plurality of conductive posts disposed on the die substrate and surrounding the integrated device; and
a protection layer encapsulating the integrated device and the plurality of conductive posts;
an insulating encapsulant encapsulating the semiconductor chip; and
a redistribution layer disposed on the insulating encapsulant and electrically connected to the plurality of conductive pillars of the integrated device and electrically connected to the plurality of conductive posts;
a second package stacked on the package structure, and electrically connected to the package structure through a plurality of conductive balls.

16. The package-on-package structure according to claim 15, wherein the package structure further comprises a plurality of through insulator vias surrounding the semiconductor chip and encapsulated by the insulating encapsulant, and the plurality of through insulator vias is electrically connected to the semiconductor chip, and is electrically connected to the second package through the plurality of conductive balls.

17. The package-on-package structure according to claim 15, wherein the package structure further comprises a plurality of conductive cores surrounding the semiconductor chip and encapsulated by the insulating encapsulant, and the plurality of conductive cores is electrically connected to the semiconductor chip, and is electrically connected to the second package through the plurality of conductive balls.

18. The package-on-package structure according to claim 17, wherein the plurality of conductive balls is partially surrounded by the insulating encapsulant.

19. The package-on-package structure according to claim 15, wherein the second package comprises:
a substrate;
pads located on two opposite surfaces of the substrate, wherein the plurality of conductive balls is electrically connected to the pads;
a plurality of second semiconductor chips located on the substrate and electrically connected to the pads through bonding wires.

20. The package-on-package structure according to claim 15, wherein the semiconductor chip further comprises a plurality of conductive bumps connected to the plurality of conductive pillars and the plurality of conductive posts, and the redistribution layer is electrically connected to the plurality of conductive pillars of the integrated device and electrically connected the plurality of conductive posts through the plurality of conductive bumps.

\* \* \* \* \*